United States Patent
Kang et al.

(10) Patent No.: US 11,170,859 B2
(45) Date of Patent: Nov. 9, 2021

(54) MEMORY DEVICE FOR PASSING VERIFY OPERATION AND OPERATING METHOD OF THE SAME

(71) Applicant: SK hynix Inc., Icheon-si (KR)

(72) Inventors: Tai Kyu Kang, Icheon-si (KR); Chul Woo Yang, Yongin-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/796,547

(22) Filed: Feb. 20, 2020

(65) Prior Publication Data

US 2021/0027847 A1  Jan. 28, 2021

(30) Foreign Application Priority Data

Jul. 22, 2019 (KR) .................. 10-2019-0088460

(51) Int. Cl.
- G11C 16/06 (2006.01)
- G11C 16/34 (2006.01)
- G11C 16/26 (2006.01)
- G11C 16/14 (2006.01)

(52) U.S. Cl.
CPC ............ G11C 16/344 (2013.01); G11C 16/14 (2013.01); G11C 16/26 (2013.01); G11C 16/349 (2013.01)

(58) Field of Classification Search
CPC .................................... G11C 16/3445
USPC .................................... 365/185.22
See application file for complete search history.

(56) References Cited

U.S. PATENT DOCUMENTS

| 6,288,940 | B1* | 9/2001 | Kawamura | G11C 29/76 365/185.09 |
| 9,653,180 | B1* | 5/2017 | Yang | G11C 11/5628 |
| 2011/0216602 | A1* | 9/2011 | Kim | G11C 16/06 365/185.22 |

FOREIGN PATENT DOCUMENTS

| KR | 1020160072706 A | 6/2016 |
| KR | 1020160133688 A | 11/2016 |

* cited by examiner

*Primary Examiner* — Hoai V Ho
(74) *Attorney, Agent, or Firm* — William Park & Associates Ltd.

(57) ABSTRACT

A memory device, including a plurality of planes, includes a mode setting component to set an operation mode of the memory device as a verify pass mode to allow a verify operation, performed in the plurality of planes, to forcibly pass; and a verify signal generator for outputting a verify pass signal signaling that the verify operation has passed for each of the plurality of planes.

12 Claims, 24 Drawing Sheets

FIG. 11B

| | FIRST ERASE OPERATION | ERASE VERIFY FAIL | SECOND ERASE OPERATION | ERASE VERIFY PASS | THIRD ERASE OPERATION | ERASE VERIFY PASS |
|---|---|---|---|---|---|---|
| Plane0 | | | | | | |
| Plane1 | FIRST ERASE OPERATION | ERASE VERIFY FAIL | SECOND ERASE OPERATION | ERASE VERIFY FAIL | THIRD ERASE OPERATION | ERASE VERIFY PASS |

FIG. 13B

| | FIRST PROGRAM OPERATION | PROGRAM VERIFY FAIL | SECOND PROGRAM OPERATION | PROGRAM VERIFY PASS | THIRD PROGRAM OPERATION | PROGRAM VERIFY PASS |
|---|---|---|---|---|---|---|
| Plane0 | FIRST PROGRAM OPERATION | PROGRAM VERIFY FAIL | SECOND PROGRAM OPERATION | PROGRAM VERIFY PASS | THIRD PROGRAM OPERATION | PROGRAM VERIFY PASS |
| Plane1 | FIRST PROGRAM OPERATION | PROGRAM VERIFY FAIL | SECOND PROGRAM OPERATION | PROGRAM VERIFY FAIL | THIRD PROGRAM OPERATION | PROGRAM VERIFY PASS |

MEMORY DEVICE FOR PASSING VERIFY OPERATION AND OPERATING METHOD OF THE SAME

CROSS-REFERENCE TO RELATED APPLICATION

The present application claims priority under 35 U.S.C. § 119(a) to Korean patent application number 10-2019-0088460, filed on Jul. 22, 2019, in the Korean Intellectual Property Office, the entire disclosure of which is incorporated herein by reference.

BACKGROUND

1. Technical Field

The present disclosure generally relates to an electronic device, and more particularly, to a memory device and an operating method thereof.

2. Related Art

A storage device is a device for storing data, controlled by a host device, such as a computer, a smart phone or a smart pad. The storage device includes a device, configured to store data on a magnetic disk, such as a Hard Disk Drive (HDD), and a device, configured to store data on a semiconductor memory, i.e., a nonvolatile memory, such as a Solid State Drive (SSD) or a memory card.

The storage device may include a memory device, configured to store data, and a memory controller, configured to control the memory device. The memory device is classified into a volatile memory device and a nonvolatile memory device. The nonvolatile memory device includes a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like.

SUMMARY

In accordance with an aspect of the present disclosure, there is provided a memory device, including a plurality of planes, the memory device including: a mode setting component configured to set an operation mode of the memory device as a verify pass mode to allow a verify operation, performed in the plurality of planes, to forcibly pass; and a verify signal generator configured to output a verify pass signal signaling that the verify operation has passed for each of the plurality of planes.

In accordance with another aspect of the present disclosure, there is provided a method for operating a memory device including a plurality of planes, the method including: setting an operation mode of the memory device to allow a verify operation, performed in the plurality of planes, to forcibly pass; and outputting a verify pass signal signaling that the verify operation has passed for each of the plurality of planes.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 11A and 11B are diagrams, illustrating an output of an erase verify pass signal or erase verify fail signal in a verify pass mode or verify fail mode and an operation of each plane.

FIGS. 13A and 13B are diagrams, illustrating an output of a program verify pass signal or program verify fail signal in the verify pass mode or verify fail mode and an operation of each plane.

DETAILED DESCRIPTION

Figure 1:
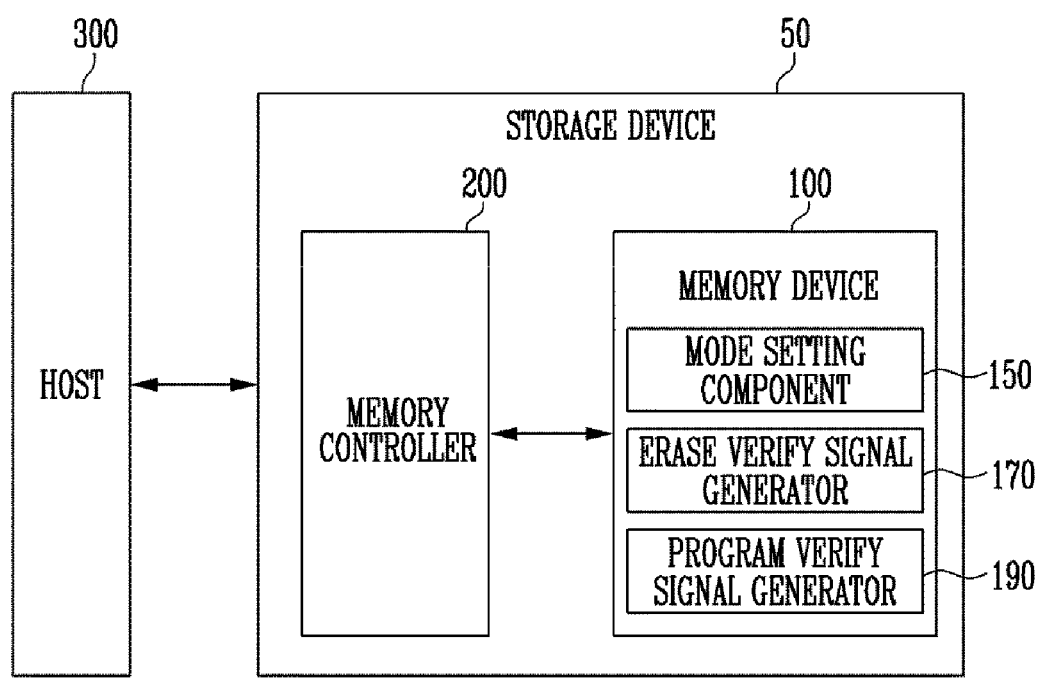
FIG. 1 is a block diagram, illustrating a storage device.

The specific structural or functional description disclosed herein is merely illustrative for the purpose of describing embodiments based on the concept of the present disclosure. The embodiments based on the concept of the present disclosure can be implemented in various forms, and cannot be construed as limited to the embodiments set forth herein.

The embodiments based on the concept of the present disclosure can be variously modified and have various shapes. Thus, the embodiments are illustrated in the drawings and are intended to be described herein in detail. However, the embodiments based on the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~between," "immediately~between" or "adjacent to~" and "directly adjacent to~" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

In describing those embodiments, description will be omitted for techniques that are well known to the art to which the present disclosure pertains, and are not directly related to the present disclosure. This intends to disclose the gist of the present disclosure more clearly by omitting unnecessary description.

Hereinafter, exemplary embodiments of the present disclosure will be described in detail with reference to the accompanying drawings in order for those skilled in the art to be able to readily implement the technical spirit of the present disclosure.

Embodiments provide a memory device capable of controlling a verify operation for each plane and an operating method of the memory device.

FIG. 1 is a block diagram, illustrating a storage device.

Referring to FIG. 1, the storage device 50 may include a memory device 100 and a memory controller 200.

The storage device 50 may be a device for storing data under the control of a host 300. The host 300 may be a mobile phone, a smart phone, an MP3 player, a laptop computer, a desktop computer, a game console, a TV, a tablet PC or an in-vehicle infotainment system.

The storage device 50 may be manufactured to be any one of the various types of storage devices that can interface with the host 300. For example, the storage device 50 may be a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, or the like.

The storage device 50 may be manufactured to be any one of the various kinds of package types. For example, the storage device 50 may be manufactured to be any one of the various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory controller 200 may control the memory device 100. The memory device 100 may include a memory cell array, including a plurality of memory cells, for storing data. The memory cell array may also include a plurality of memory blocks. Each memory block may include a plurality of memory cells, and the plurality of memory cells may constitute a plurality of pages. In the embodiment, a page may be a unit for storing data in the memory device 100 or reading data stored in the memory device 100. The memory block may be a unit for erasing data.

In the embodiment, the memory device 100 may include a mode setting component 150. The mode setting component 150 may set an erase verify operation or program verify operation, included in an erase loop or program loop, performed for each plane included in the memory device 100, to forcibly pass.

Conventionally, the erase verify operation or program verify operation, performed for each plane included in the memory device 100, is not allowed to forcibly pass. Therefore, when Sudden Power Off (SPO) occurs, the memory device 100 re-performs a suspended operation from the beginning. That is, in order to re-perform the suspended operation, the memory device 100 performs the erase operation or program operation on all planes even when an erase verify operation or a program verify operation has passed in one of the planes.

Accordingly, in the present disclosure, the erase verify operation or program verify operation is allowed to forcibly pass for each plane so that, when an SPO occurs, the efficiency of an operation may improve. That is, a recovery operation is not performed for any plane with a passing erase verify operation or a passing program verify operation. The recovery operation is omitted by subdividing a suspended operation in a recovery process, after the occurrence of an SPO, so that the recovery operation can be rapidly performed.

In the embodiment, the mode setting component 150 may perform an operation to set an erase verify operation or a program verify operation to forcibly pass for each of a plurality of planes included in the memory cell array.

In the embodiment, the mode setting component 150 may perform an operation to allow an erase verify operation or program verify operation included in a specific erase loop or specific program loop to forcibly pass. Alternatively, the mode setting component 150 may perform an operation to set an erase verify operation, performed during an erase operation of the memory device 100, to forcibly pass or setting a program verify operation, performed during a program operation of the memory device 100, to forcibly pass.

In the embodiment, the memory device 100 may include a verify signal generator. The verify signal generator may include a signal to allow an erase verify operation or program verify operation, for each plane included in the memory device 100, to forcibly pass. The verify signal generator may include an erase verify signal generator 170 to allow an erase verify operation to forcibly pass and/or a program verify signal generator 190 to allow a program verify operation to forcibly pass.

In the embodiment, the memory device 100 may include the erase verify signal generator 170.

The erase verify signal generator 170 may be configured with a plurality of plane erase verify signal generators based on the number of planes included in the memory device 100. P may be a natural number greater than 1. That is, when the number of planes in the memory device 100 is P, the erase verify signal generator 170 may be configured with P plane erase verify signal generators (e.g., first to Pth plane erase verify signal generators). The first to Pth plane erase verify signal generators may respectively correspond to first to Pth planes.

Therefore, each of the first to Pth plane erase verify signal generators may output an erase verify pass signal of the corresponding plane.

In the embodiment, each of the plurality of plane erase verify signal generators, included in the erase verify signal generator 170, may output an erase verify pass signal based on the number of erase loops or erase verify pass setting information, which is received from the mode setting component 150.

Specifically, each of the plurality of plane erase verify signal generators may accumulate and count an erase loop number whenever an erase loop, on a corresponding plane, is performed. When the erase loop number, counted for each plane, is equal to that of the corresponding plane, which is received from the mode setting component 150, the plane erase verify signal generator may output an erase verify pass signal.

In the embodiment, the memory device 100 may include the program verify signal generator 190.

The program verify signal generator 190 may be configured with a plurality of plane program verify signal generators based on the number of planes included in the memory device 100. P may be a natural number greater than 1. That is, when the number of planes in the memory device 100 is P, the program verify signal generator 190 may be configured with P plane program verify signal generators (e.g., first to Pth plane program verify signal generators). The first to Pth plane program verify signal generators may respectively correspond to the first to Pth planes.

Therefore, each of the first to Pth plane program verify signal generators may output a program verify pass signal of the corresponding plane.

In the embodiment, each of the plurality of plane program verify signal generators, included in the program verify signal generator 190, may output a program verify pass signal based on the number of program loops or program verify pass setting information, which is received from the mode setting component 150.

Specifically, each of the plurality of plane program verify signal generators may accumulate and count a program loop number whenever a program loop, on a corresponding plane, is performed. When the program loop number, counted for each plane, is equal to that of the corresponding plane, which is received from the mode setting component 150, the plane program verify signal generator may output a program verify pass signal.

In the embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory will be assumed and described below.

In the embodiment, the memory device 100 may be implemented in a two-dimensional array structure or a three-dimensional array structure. Hereinafter, an embodiment will be described based on the memory device 100 being implemented in the three-dimensional array structure. However, the present disclosure is not limited to the three-dimensional array structure. The present disclosure may be applied to, not only a flash memory device in which a charge storage layer is configured with a Floating Gate (FG), but also a Charge Trap Flash (CTF) in which a charge storage layer is configured with an insulating layer.

In the embodiment, the memory device 100 may be operated using a Single Level Cell (SLC) scheme in which one data bit is stored in one memory cell. Alternatively, the memory device 100 may be operated using a scheme in which at least two data bits are stored in one memory cell. For example, the memory device 100 may be operated using a Multi-Level Cell (MLC) scheme in which two data bits are stored in one memory cell, a Triple Level Cell (TLC) scheme in which three data bits are stored in one memory cell, or a Quadruple Level Cell (QLC) scheme in which four data bits are stored in one memory cell.

The memory device 100 is configured to receive a command and an address from the memory controller 200 and configured to access an area selected by the address in the memory cell array. That is, the memory device 100 may perform an operation, corresponding to the command, on the area selected by the address. For example, the memory device 100 may perform a write (program) operation, a read operation, and an erase operation based on the received command. For example, when a program command is received, the memory device 100 may program data in the area selected by the address. When a read command is received, the memory device 100 may read data from the area selected by the address. When an erase command is received, the memory device 100 may erase data stored in the area selected by the address.

The memory controller 200 may control overall operations of the storage device 50.

When a power voltage is applied to the storage device 50, the memory controller 200 may execute firmware (FW). When the memory device 100 is a flash memory device, the memory controller 200 may execute FW, such as a flash translation layer (FTL) that controls the communication between the host 300 and the memory device 100.

In the embodiment, the memory controller 200 may receive data and a Logical Block Address (LBA) from the host 300, and translate the LBA into a Physical Block Address (PBA), representing the addresses of memory cells included in the memory device 100, in which data is to be stored.

Furthermore, the memory controller 200 may further include a buffer memory (not shown).

The memory controller 200 may store, in a buffer memory, a logical-physical address mapping table that establishes a mapping relationship between the LBA and the PBA.

The memory controller 200 may control the memory device 100 to perform a program operation, a read operation, an erase operation, or the like, in response to a request from the host 300. For example, when a program request is received from the host 300, the memory controller 200 may change the program request into a program command and provide the program command, a PBA, and data to the memory device 100. When a read request is received together with an LBA from the host 300, the memory controller 200 may change the read request to a read command, select a PBA corresponding to the LBA, and then provide the read command and the PBA to the memory device 100. When an erase request is received together with an LBA from the host 300, the memory controller 200 may change the erase request into an erase command, select a PBA corresponding to the LBA, and then provide the erase command and the PBA to the memory device 100.

In the embodiment, the memory controller 200 may autonomously generate a program command, an address, and data, without any request from the host 300, and transmit the program command, the address, and the data to the memory device 100. For example, the memory controller 200 may provide the command, the address, and the data to the memory device 100 to perform background operations such as a program operation for wear leveling and a program operation for garbage collection.

In the embodiment, the memory controller 200 may control the data exchange between the host 300 and the buffer memory. Alternatively, the memory controller 200 may temporarily store system data that controls the memory device 100 in the buffer memory. For example, the memory controller 200 may temporarily store data, input from the host 300, in the buffer memory, and then transmit the data, temporarily stored in the buffer memory, to the memory device 100.

In various embodiments, the buffer memory may be used as a working memory or a cache memory of the memory controller 200. The buffer memory may store codes or commands executed by the memory controller 200. Alternatively, the buffer memory may store data processed by the memory controller 200.

In the embodiment, the buffer memory may be implemented with a Dynamic Random Access Memory (DRAM) such as a Double Data Rate Synchronous DRAM (DDR SDRAM), a DDR4 SDRAM, a Low Power Double Data Rate 4 (LPDDR4) SDRAM, a Graphics Double Data Rate (GDDR) SRAM, a Low Power DDR (LPDDR), or a Rambus Dynamic Random Access Memory (RDRAM), or a Static Random Access Memory (SRAM).

In various embodiments, the buffer memory may be included inside the storage device 50 or may be coupled to the storage device 50, meaning the buffer memory may be outside of the storage device 50.

In the embodiment, the memory controller 200 may control at least two memory devices 100. The memory controller 200 may control the memory devices based on an interleaving scheme so as to improve operational performance.

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
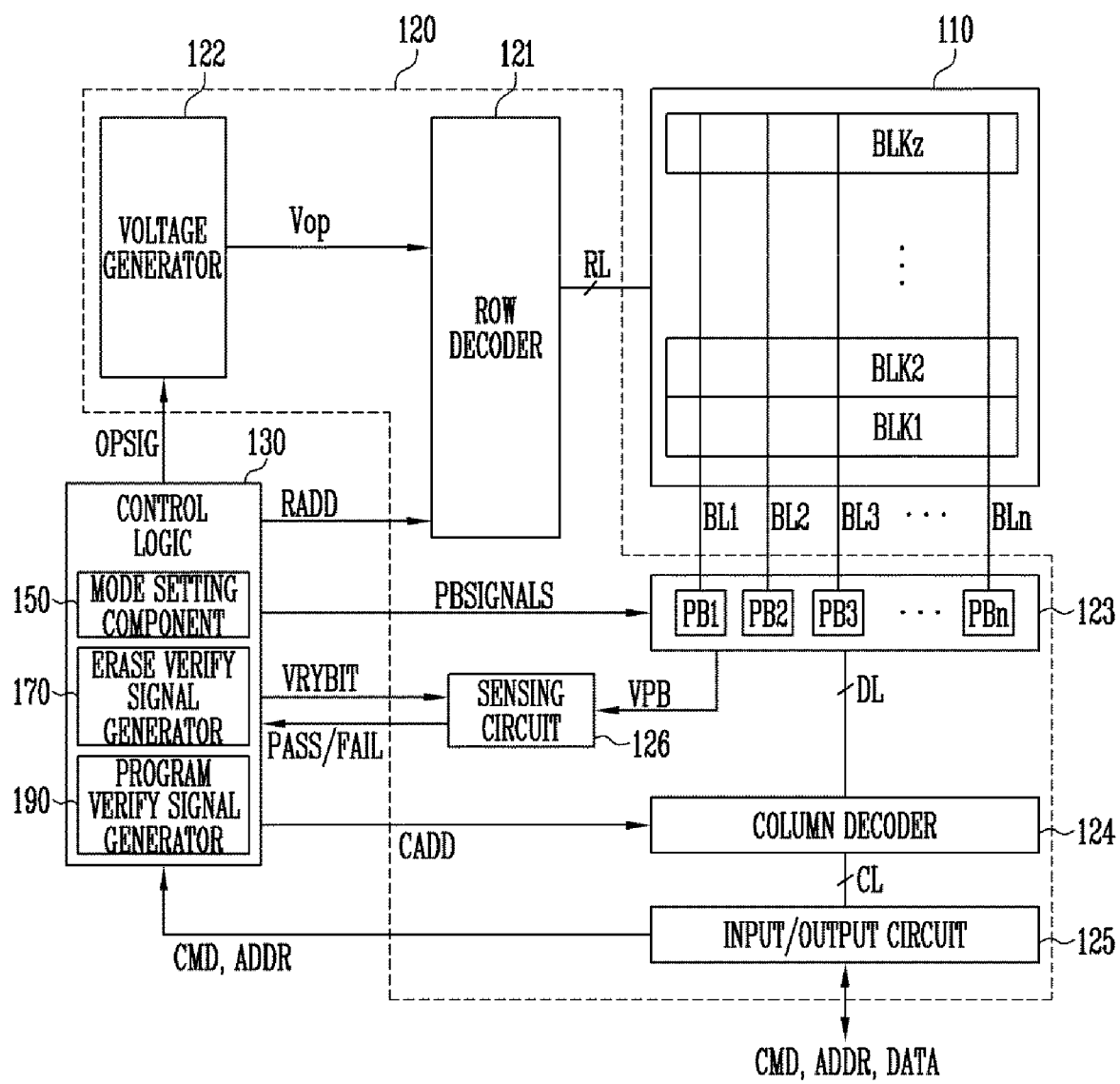
FIG. 2 is a diagram, illustrating a structure of a memory device, shown in FIG. 1.

FIG. 2 is a diagram, illustrating a structure of the memory device, shown in FIG. 1.

Referring to FIG. 2, the memory device 100 may include a memory cell array 100, a peripheral circuit 120, and a control logic 130. The control logic 130 may include a mode setting component 150, an erase verify signal generator 170, and a program verify signal generator 190.

The memory cell array 110 includes a plurality of memory blocks BLK1 to BLKz. The plurality of memory blocks BLK1 to BLKz are coupled to a row decoder 121 through row lines RL. The plurality of memory blocks BLK1 to BLKz are coupled to a page buffer group 123 through bit lines BL1 to BLn. Each of the plurality of memory blocks BLK1 to BLKz includes a plurality of memory cells. In the embodiment, the plurality of memory cells may be nonvolatile memory cells. Memory cells coupled to the same word line may be defined as one page. Therefore, one memory block may include a plurality of pages.

The row lines RL may include at least one source select line, a plurality of word lines, and at least one drain select line.

Each of the memory cells, included in the memory cell array 110, may be configured as a Single Level Cell (SLC) that stores one data bit, a Multi-Level Cell (MLC) that stores two data bits, a Triple Level Cell (TLC) that stores three data bits, or a Quad Level Cell (QLC) that stores four data bits.

The peripheral circuit 120 may perform a program operation, a read operation or an erase operation on a selected region of the memory cell array 110 based on the control logic 130. The peripheral circuit 120 may drive the memory cell array 110. For example, the peripheral circuit 120 may apply various operating voltages to the row lines RL and the bit lines BL1 to BLn or may discharge the applied voltages based on the control logic 130.

The peripheral circuit 120 may include the row decoder 121, the voltage generator 122, the page buffer group 123, a column decoder 124, an input/output circuit 125, and a sensing circuit 126.

The row decoder 121 is coupled to the memory cell array 110 through the row lines RL. The row lines RL may include at least one source select line, a plurality of word lines, and at least one drain select line. In the embodiment, the word lines may include normal word lines and dummy word lines. In the embodiment, the row lines RL may further include a pipe select line.

The row decoder 121 decodes row address RADD received from the control logic 130. The row decoder 121 selects at least one memory block among the memory blocks BLK1 to BLKz based on the decoded address. Also, the row decoder 121 may select at least one word line of the selected memory block to apply voltages, generated by the voltage generator 122, to the at least one word line WL according to the decoded address.

For example, in a program operation, the row decoder 121 may apply a program voltage to the selected word line, and apply a program pass voltage, having a level lower than that of the program voltage, to the unselected word lines. In a program verify operation, the row decoder 121 may apply a verify voltage to the selected word line, and apply a verify pass voltage, having a level higher than that of the verify voltage, to the unselected word lines.

In a read operation, the row decoder 121 may apply a read voltage to the selected word line, and apply a read pass voltage, having a level higher than that of the read voltage, to the unselected word lines.

In the embodiment, an erase operation of the memory device 100 is performed in a memory block unit. In the erase operation, the row decoder 121 may select one memory block based on the decoded address. In the erase operation, the row decoder 121 may apply a ground voltage to the word lines, coupled to the selected memory blocks.

The voltage generator 122 operates under the control of the control logic 130. The voltage generator 122 generates a plurality of voltages by using an external power voltage that is supplied to the memory device 100. Specifically, the voltage generator may generate various operating voltages Vop, used in program, read, and erase operations, in response to an operation signal OPSIG. For example, the voltage generator 122 may generate a program voltage, a verify voltage, a pass voltage, a read voltage, an erased voltage, and the like, based on the control logic 130.

In the embodiment, the voltage generator 122 may generate an internal power voltage by regulating the external power voltage. The internal power voltage generated by the voltage generator 122 is used as an operation voltage of the memory device 100.

In the embodiment, the voltage generator 122 may generate a plurality of voltages by using the external power voltage or the internal power voltage.

For example, the voltage generator 122 may include a plurality of pumping capacitors to receive the internal power voltage and to generate the plurality of voltages by selectively activating the plurality of pumping capacitors based on the control logic 130.

The plurality of generated voltages may be supplied to the memory cell array 110 by the row decoder 121.

The page buffer group 123 includes first to nth page buffers PB1 to PBn. The first to nth page buffers PB1 to PBn are coupled to the memory cell array 110, respectively, through first to nth bit lines BL1 to BLn. The first to nth bit lines BL1 to BLn operate under the control of the control logic 130. Specifically, the first to nth bit lines BL1 to BLn may operate in response to page buffer control signals PBSIGNALS. For example, the first to nth page buffers PB1 to PBn may temporarily store data, received through the first to nth bit lines BL1 to BLn, or sense the voltages or the current of the bit lines BL1 to BLn in a read or verify operation.

Specifically, in a program operation, when a program voltage is applied to a selected word line, the first to nth page buffers PB1 to PBn may transfer data DATA, received through the input/output circuit 125, to selected memory cells through the first to nth bit lines BL1 to BLn. Memory cells of a selected page are programmed based on the transferred data DATA. In a program verify operation, the first to nth page buffers PB1 to PBn read page data by sensing the voltages or the currents, received from the selected memory cells, through the first to nth bit lines BL1 to BLn.

In a read operation, the first to nth page buffers PB1 to PBn read data DATA from the memory cells of the selected page, through the first to nth bit lines BL1 to BLn, and outputs the read data DATA to the input/output circuit 125 under the control of the column decoder 124.

In an erase operation, the first to nth page buffers PB1 to PBn may float the first to nth bit lines BL1 to BLn or apply an erase voltage.

The column decoder 124 may communicate data between the input/output circuit 125 and the page buffer group 123 in response to a column address CADD. For example, the column decoder 124 may communicate data with the first to nth page buffers PB1 to PBn through data lines DL or communicate data with the input/output circuit 125 through column lines CL.

The input/output circuit 125 may transfer a command CMD and an address ADDR, received from the memory controller 200 (with reference to FIG. 1), to the control logic 130 or exchange data DATA with the column decoder 124.

In a read operation or verify operation, the sensing circuit 125 may generate a reference current in response to an allow bit VRYBIT signal, and output a pass or fail signal PASS/FAIL by comparing a sensing voltage VPB, received from the page buffer group 123, and a reference voltage, generated by the reference current.

In response to the command CMD and the address ADDR, the control logic 130 may control the peripheral circuit 120 by outputting the operation signal OPSIG, the row address RADD, the page buffer control signals PBSIGNALS, and the allow bit VRYBIT. Also, in response to the pass or fail signal PASS/FAIL, the control logic 130 may determine whether the verify operation has passed or failed.

Each of the memory cells, included in the memory cell array 110, may be programmed to one program state among a plurality of program states based on data stored therein. A target program state of a memory cell may be determined as any one of the plurality of program states based on data stored therein.

In the embodiment, the control logic 130 may include the mode setting component 150. When the memory device 100 performs an erase loop or program loop, the mode setting component 150 may set an operation mode of the memory device 100 as a verify pass mode. The verify pass mode may be an operation mode of the memory device 100, which is used to allow an erase verify operation, included in the erase loop, or a program verify operation, included in the program loop, to forcibly pass. When the operation mode of the memory device 100 is set as the verify pass mode, the mode setting component 150 may perform an operation to set the erase verify operation or program verify operation to pass.

Specifically, the mode setting component 150 may set an erase loop number that allows an erase verify pass signal to be output, in an erase verify operation included in a specific erase loop. Also, the mode setting component 150 may set a program loop number that allows a program verify pass signal to be output, in a program verify operation included in a specific program loop. The mode setting component 150 may provide the set erase loop number to the erase verify signal generator 170, and provide the set program loop number to the program verify signal generator 190.

In the embodiment, while the memory device 100 is performing a specific erase loop or specific program loop, the mode setting component 150 may perform an operation to set an erase verify operation included in the corresponding erase loop or a program verify operation included in the corresponding program loop to forcibly pass.

Specifically, the mode setting component 150 may provide the erase verify signal generator 170 with the erase verify pass setting information to set an erase verify operation, included in an erase loop, to pass. Alternatively, the mode setting component 150 may provide the program verify signal generator 190 with the program verify pass setting information to set a program verify operation in a program loop to pass.

In the embodiment, the control logic 130 may include a verify signal generator (not shown). The verify signal generator (not shown) may output a signal to allow an erase verify operation or a program verify operation to forcibly pass for each plane included in the memory device 100. The verify signal generator (not shown) may include the erase verify signal generator 170 to allow an erase verify operation to forcibly pass and/or the program verify signal generator 190 to allow a program verify operation to forcibly pass.

In the embodiment, the control logic 130 may include the erase verify signal generator 170. The erase verify signal generator 170 may include plane erase verify signal generators of which number is equal to that of planes included in the memory device 100. Each of the plane erase verify signal generators, included in the erase verify signal generator 170, may receive a pass signal or a fail signal PASS/FAIL for a corresponding plane from the sensing circuit 126. The pass signal or the fail signal PASS/FAIL may represent the pass or fail of an erase verify operation.

The erase verify signal generator 170 may receive an erase loop number of the erase verify pass setting information for each plane from the mode setting component 150. When the erase verify signal generator 170 receives an erase loop number or erase verify pass setting information from the mode setting component 150, a plane erase verify signal generator, corresponding to the erase loop number or erase verify pass setting information, may output an erase verify pass signal, regardless of a signal received from the sensing circuit 126.

Specifically, when the erase verify signal generator 170 receives an erase loop number of a specific plane from the mode setting component 150, a plane erase verify signal generator, corresponding to the specific plane, may count an erase loop number of the plane. When the counted erase loop number is equal to that received from the mode setting component 150, the plane erase verify signal generator may output an erase verify pass signal to the memory controller (200 shown in FIG. 1).

In the embodiment, when the erase verify signal generator 170 receives the erase verify pass setting information of a specific plane from the mode setting component 150, a plane erase verify signal generator, corresponding to the specific plane, may output an erase verify pass signal to the memory controller.

In the embodiment, the control logic 130 may include the program verify signal generator 190. The program verify signal generator 170 may include plane program verify signal generators of which number is equal to that of planes included in the memory device 100. Each of the plane program verify signal generators included in the program verify signal generator 190 may receive a pass signal or fail signal PASS/FAIL for a corresponding plane from the sensing circuit 126. The pass signal or fail signal PASS/FAIL may represent pass or fail of a program verify operation.

The program verify signal generator 170 may receive a program loop number of erase verify pass setting information for each plane from the mode setting component 150. When the program verify signal generator 190 receives a program loop number or program verify pass setting information from the mode setting component 150, a plane program verify signal generator, corresponding to the program loop number or program verify pass setting information, may output a program verify pass signal, regardless of a signal received from the sensing circuit 126.

Specifically, when the program verify signal generator 190 receives a program loop number of a specific plane from the mode setting component 150, a plane program verify signal generator corresponding to the specific plane may count a program loop number of the plane. When the counted program loop number is equal to that received from the mode setting component 150, the plane program verify signal generator may output a program verify pass signal to the memory controller.

In the embodiment, when the program verify signal generator 190 receives program verify pass setting information of a specific plane from the mode setting component 150, a plane program verify signal generator corresponding to the specific plane may output a program verify pass signal to the memory controller.

Figure 3:
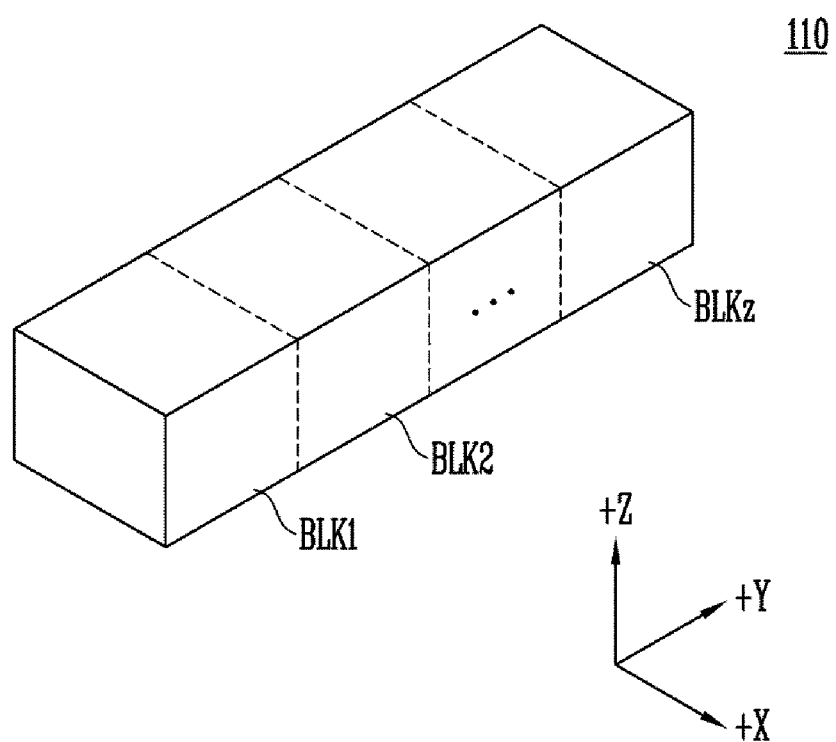
FIG. 3 is a diagram, illustrating an embodiment of a memory cell array, shown in FIG. 2.

FIG. 3 is a diagram, illustrating an embodiment of the memory cell array, shown in FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 4 and 5.

Figure 4:
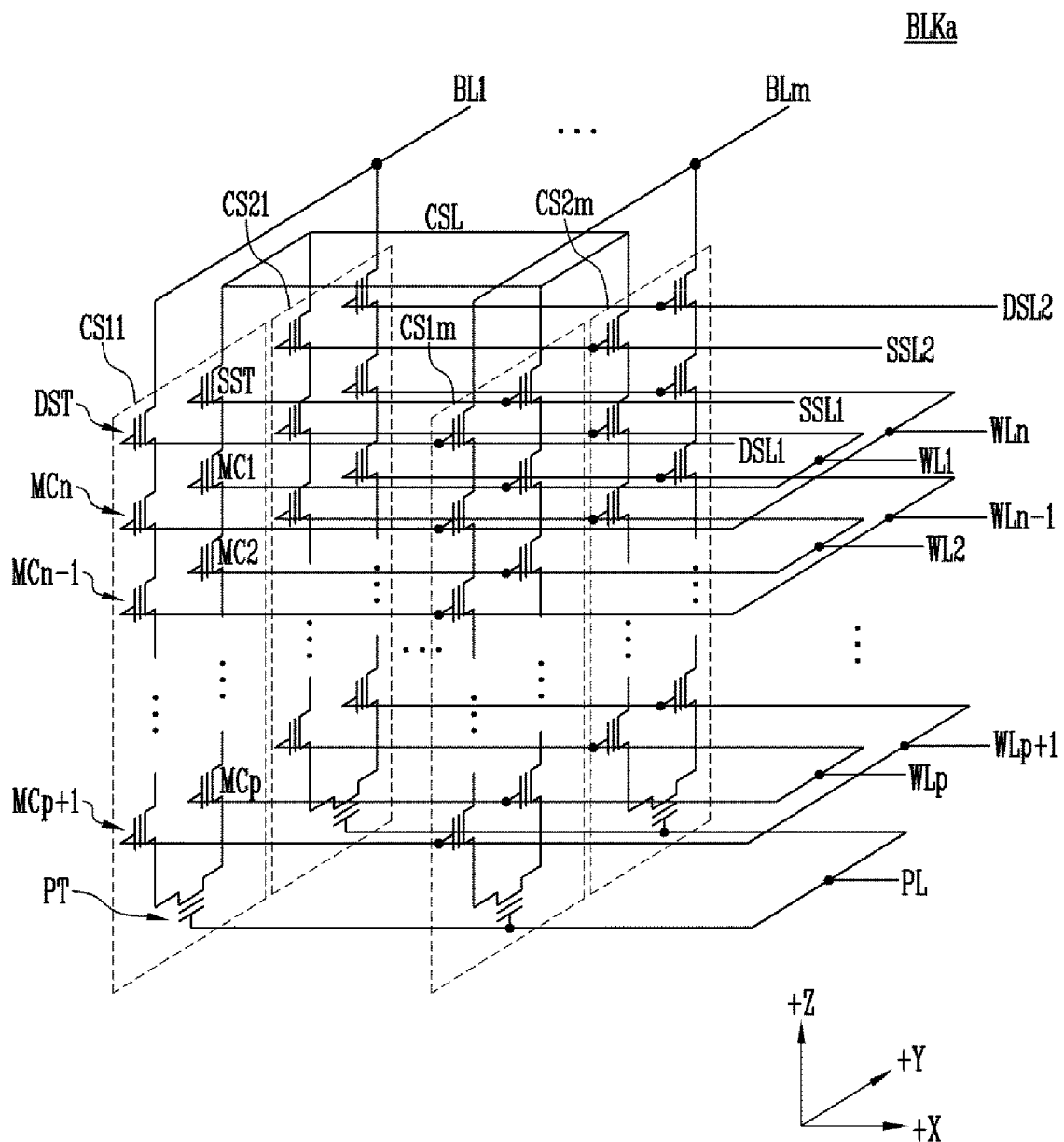
FIG. 4 is a circuit diagram, illustrating any one memory block among memory blocks, shown in FIG. 3.

FIG. 4 is a circuit diagram, illustrating any one memory block BLKa among the memory blocks BLK1 to BLKz, shown in FIG. 3.

Referring to FIG. 4, the memory block BLKa may include a plurality of cell strings CS11 to CS1$m$ and CS21 to CS2$m$. In the embodiment, each of the plurality of cell strings CS11 to CS1$m$ and CS21 to CS2$m$ may be formed in a 'U' shape. In the memory block BLKa, m cell strings are arranged in a row direction (i.e., a +X direction). FIG. 4 illustrates two cell strings, arranged in a column direction (i.e., a +Y direction). However, the embodiment of FIG. 4 is merely for convenience of description, and it will be understood that three or more cell strings may be arranged in the column direction.

Each of the plurality of cell strings CS11 to CS1$m$ and CS21 to CS2$m$ may include at least one source select transistor SST, first to nth memory cells MC1 to MCn, a pipe transistor PT, and at least one drain select transistor DST.

The source select transistor SST of each cell string is coupled between a common source line CSL and memory cells MC1 to MCp.

In the embodiment, the source select transistors of cell strings, arranged on the same row, are coupled to a source select line extending in the row direction. On the other hand, the source select transistors of cell strings, arranged on different rows, are coupled to different source select lines. In FIG. 4, the source select transistors of the cell strings CS11 to CS1$m$, on the first row, are coupled to a first source select line SSL1. The source select transistors of the cell strings CS21 to CS2$m$, on the second row, are coupled to a second source select line SSL2.

In another embodiment, the source select transistors of the cell strings CS11 to CS1$m$ and CS21 to CS2$m$ may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled, in series, between the source select transistor SST and the pipe transistor PT. The (p+1)th to nth memory cells MCp+1 to MCn are sequentially arranged in the +Z direction and are coupled, in series, between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings, arranged in the row direction, are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings, arranged in the column direction, are coupled to a bit line extending in the column direction. In FIG. 4, the cell strings CS11 and CS21 on a first column are coupled to a first bit line BL1. The cell strings CS1m and CS2m on an mth column are coupled to an mth bit line BLm.

Memory cells, coupled to the same word line in the cell strings, arranged in the row direction, constitute one page. For example, memory cells coupled to the first word line WL1 in the cell strings CS11 to CS1m on the first row constitute one page. Memory cells, coupled to the first word line WL1 in the cell strings CS21 to CS2m, on the second row, constitute another page. As any one of the drain select lines DSL1 and DSL2 is selected, cell strings, arranged in one row direction, may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m, arranged in the row direction, may be coupled to the even bit lines, respectively, and odd-numbered cell strings among the cell strings CS11 to CS1m or CS21 to CS2m, arranged in the row direction, may be coupled to the odd bit lines, respectively.

In the embodiment, at least one of the first to nth memory cells MC1 to MCn may be used as a dummy memory cell. For example, the at least one dummy memory cell may decrease the electric field between the source select transistor SST and the memory cells MC1 to MCp. Alternatively, the at least one dummy memory cell may decrease the electric field between the drain select transistor DST and the memory cells MCp+1 to MCn. When the number of dummy memory cells increases, the reliability of the operation of the memory block BLKa is improved. On the other hand, the size of the memory block BLKa increases. When the number of dummy memory cells decreases, the size of the memory block BLKa decreases. On the other hand, the reliability of the operation of the memory block BLKa may decrease.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 5:
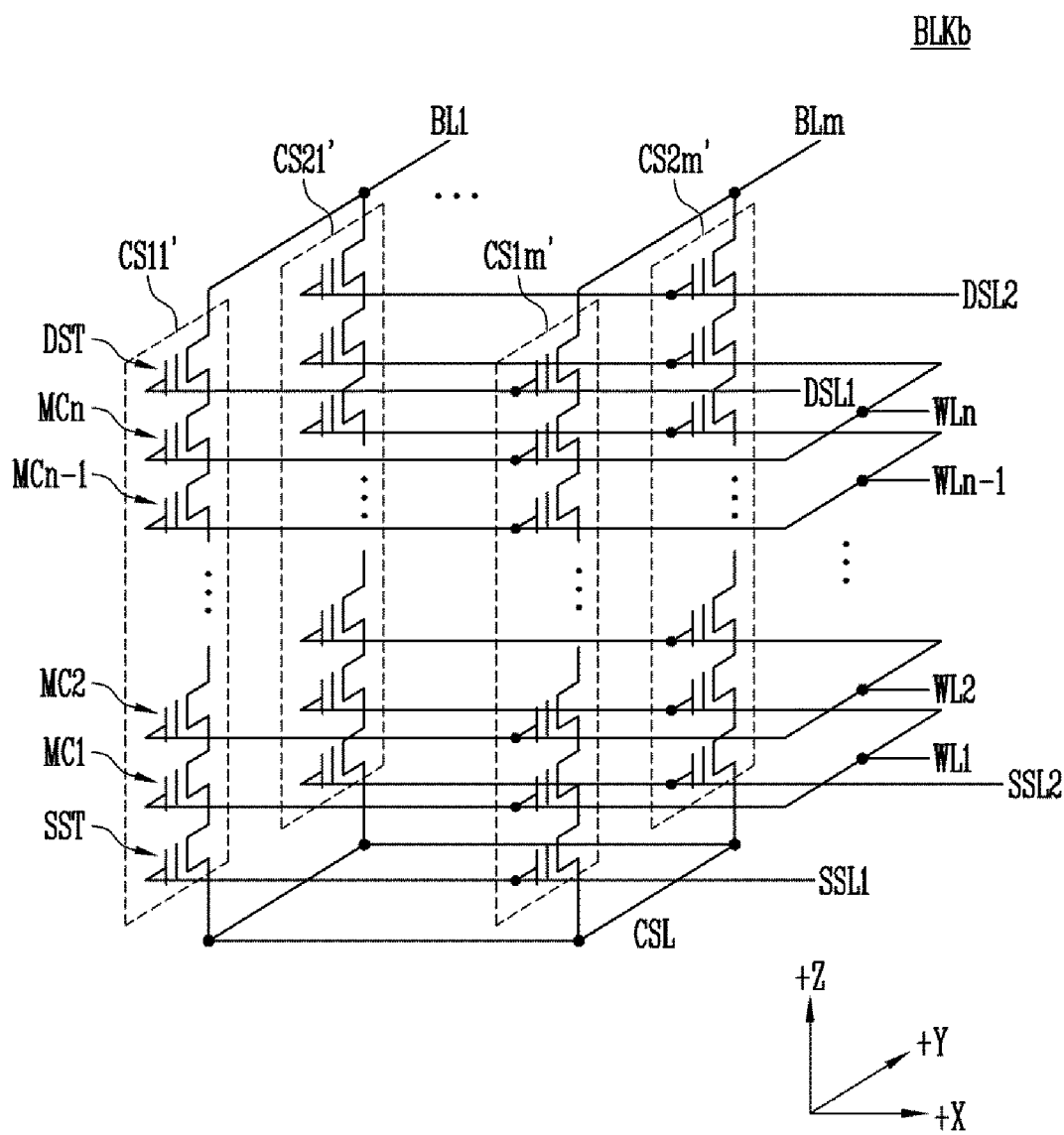
FIG. 5 is a circuit diagram, illustrating another embodiment of the one memory block among the memory blocks, shown in FIG. 3.

FIG. 5 is a circuit diagram, illustrating another embodiment BLKb of the one memory block among the memory blocks BLK1 to BLKz, shown in FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings, arranged on the same row, are coupled to the same source select line. The source select transistors of the cell strings CS11' to CS1m', arranged on a first row, are coupled to a first source select line SSL1. Source select transistors of the cell strings CS21' to CS2m', arranged on a second row, are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled, in series, between the source select transistor SST and the drain select transistor DST. Gate electrodes of the first to nth memory cells MC1 to MCn are coupled to the first to nth word lines WL1 to WLn, respectively.

The drain select transistor DST of each cell string is coupled between a corresponding bit line and the memory cells MC1 to MCn. The drain select transistors of cell strings, arranged in the row direction, are coupled to a drain select line extending in the row direction. The drain select transistors of the cell strings CS11' to CS1m' on the first row are coupled to a first drain select line DSL1. The drain select transistors of the cell strings CS21' to CS2m', on the second row, are coupled to a second drain select line DSL2.

Consequently, the memory block BLKb of FIG. 5 has a circuit similar to that of the memory block BLKa of FIG. 4, a difference being that the pipe transistor PT is excluded from each cell string in FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m', arranged in the row direction, may be coupled to the even bit lines, respectively, and odd-numbered cell strings among the cell strings CS11' to CS1m' or CS21' to CS2m', arranged in the row direction, may be coupled to the odd bit lines, respectively.

In addition, at least one of the first to nth memory cells MC1 to MCn may be used as a dummy memory cell so as to decrease an electric field between the source select transistor SST and the memory cells MC1 to MCn.

Figure 6:
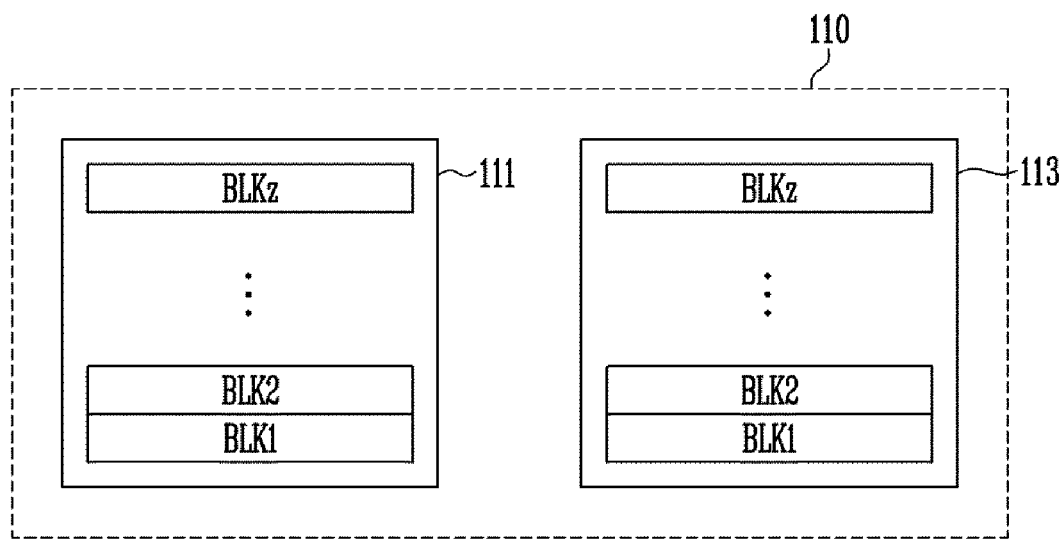
FIG. 6 is a diagram illustrating a multi-plane structure.

FIG. 6 is a diagram illustrating a multi-plane structure.

Referring to FIG. 6, FIG. 6 illustrates multi-planes 111 and 113 that are included in a memory cell array 110. Although FIG. 2 shows an embodiment where the memory cells array (110 shown in FIG. 2) includes a single plane, FIG. 6 shows an embodiment where the memory cell array 110 has a multi-plane structure in which a plurality of planes are provided. FIG. 6 illustrates a case where the number of planes is 2. However, in another embodiment, the memory cell array may include a larger number of planes.

In the embodiment, the memory cell array 110 may include a zeroth plane 111 (i.e., Plane0) and a first plane 113 (i.e., Plane1). Each of the zeroth plane 111 and the first plane 113 may include a plurality of memory blocks BLK1 to BLKz. Each of the plurality of memory blocks BLK1 to BLKz may include a plurality of memory cells.

The memory cells, respectively included in the zeroth plane 111 and the first plane 113, may have different operating speeds. That is, although it is ideal that the memory cells operate at the same speed, a difference between physical characteristics of the memory cells may occur due to limitation of a manufacturing process of the memory cells. The difference between physical characteristics of the memory cells may cause a difference between electrical characteristics of the memory cells. Therefore, the memory cells may be programmed or erased at different speeds.

Due to a difference between operating speeds of the memory cells, times at which an erase operation or program operation is completed may be different from each other, even when the same erase or program voltage is applied for every plane. Therefore, since the memory cells, included in the respective planes, may have different operating speeds, an erase verify operation, performed in any one plane, may pass, while an erase verify operation, performed in another plane, may fail. In addition, a program verify operation, performed in any one plane, may pass, while a program verify operation, performed in another plane, may fail.

In the embodiment, operations performed in the zeroth plane 111 and the first plane 113 may be simultaneously performed. That is, in a multi-plane operation, an erase loop or program loop may be simultaneously performed in the zeroth plane 111 and the first plane 113. However, as described above, although an erase loop or program loop is simultaneously performed in multi-planes, the times at which an erase verify operation or program verify operation passes in respective planes may be different due to the different operating speeds of the memory cells.

Conventionally, to solve this issue, a test operation was performed by allowing an erase verify operation or program verify operation to forcibly pass in a test process.

However, after the products were produced, the time at which the erase verify operation or program verify operation passed was not arbitrarily set. Accordingly, in the present disclosure, a method is proposed to set a time at which each verify operation passes.

Furthermore, in the present disclosure, a method is proposed to perform an operation for testing in a state in which threshold voltage distributions of memory cells, included in respective planes, are different from each other, by setting different times at which an erase verify operation or program verify operation passes in the respective planes.

Figure 7:
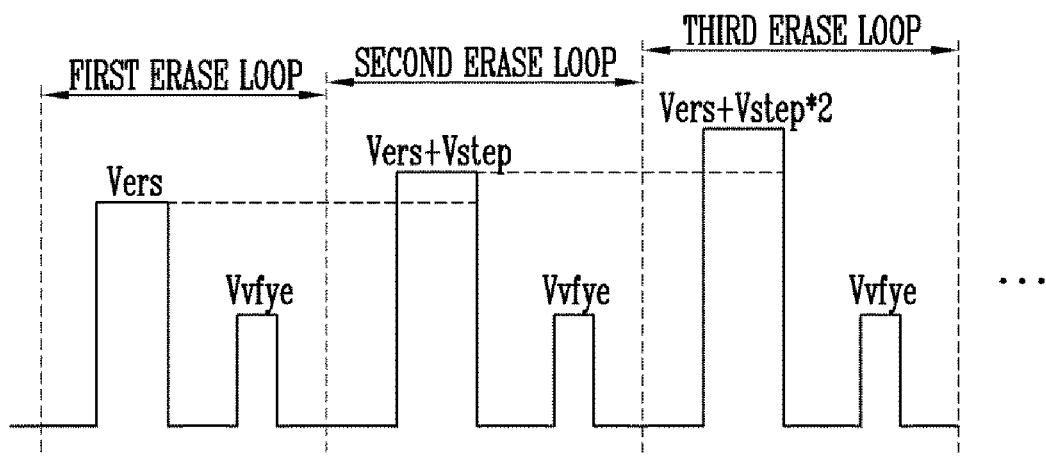
FIG. 7 is a diagram illustrating erase loops.

FIG. 7 is a diagram illustrating erase loops.

Referring to FIG. 7, FIG. 7 illustrates erase loops, each simultaneously performed in planes, in a multi-plane operation. Although only first to third erase loops are illustrated in FIG. 7, a larger number of erase loops may be performed in each plane.

In the embodiment, each erase loop may include an erase operation and an erase verify operation. Specifically, the first erase loop may include a first erase operation and an erase verify operation, the second erase loop may include a second erase operation and an erase verify operation, and the third erase loop may include a third erase operation and an erase verify operation.

In the embodiment, in a multi-plane operation, the first erase loop may be performed in each plane. The first erase loop may be performed in a specific memory block included in each of the multi-planes.

Specifically, the first erase operation, included in the first erase loop, may be performed in each plane. In the first erase operation, an erase voltage Vers may be applied to a source select line or a substrate of the specific memory block included in each of the multi-planes. After the erase voltage Vers is applied, the erase verify operation, included in the first erase loop, may be performed. In the erase verify operation, an erase verify voltage Vvfye may be applied to a plurality of word lines, coupled to the specific memory block, included in each of the multi-planes. Through the erase verify operation, it may be determined whether the specific memory block, included in each of the multi-planes, has been erased.

When there is a plane in which the erase verify operation, included in the first erase loop, does not pass, the second erase loop may be performed in the plane in which the erase verify operation does not pass. That is, since the erase speeds of memory cells, included in the respective multi-planes, are different from each other, there may be a plane in which the erase verify operation does not pass. Therefore, an additional erase loop may be performed in the plane in which the erase verify operation does not pass.

Specifically, the second erase operation, included in the second erase loop, may be performed in the plane. In the second erase operation, a second voltage, higher than the erase voltage Vers, may be applied to the source select line or a substrate of a specific memory block included in the plane. Specifically, the second voltage Vers+Vstep may be a step voltage Vstep higher than the erase voltage Vers. After the second voltage Vers+Vstep is applied, the erase verify operation, included in the second erase loop, may be performed. In the erase verify operation, an erase verify voltage Vvfye may be applied to the plurality of word lines, coupled to the specific memory block, included in the plane. Through the erase verify operation, it may be determined whether the specific memory block, included in the plane, has been erased.

Subsequently, when there is a plane in which the erase verify operation, included in the second erase loop, does not pass, the third erase loop may be performed in the plane in which the erase verify operation does not pass.

In the third erase operation, included in the third erase loop, a third voltage, higher than the second voltage Vers+Vstep, may be applied to the source select line or a substrate of a specific memory block included in the plane. Specifically, the third voltage Vers+Vstep*2 may be a step voltage Vstep higher than second voltage Vers+Vstep. Subsequently, it may be determined whether the specific memory block, included in the plane, has been erased through the erase verify operation included in the third erase loop.

When there is a plane in which the erase verify operation does not pass, even after the first to third erase loops have been performed, an additional erase loop may be performed in the plane. That is, in the multi-plane operation, an additional operation may be performed only when all the erase verify operations of all the planes have not passed, and therefore, erase loops may be performed until the erase verify operation of all the planes passes.

Figure 8:
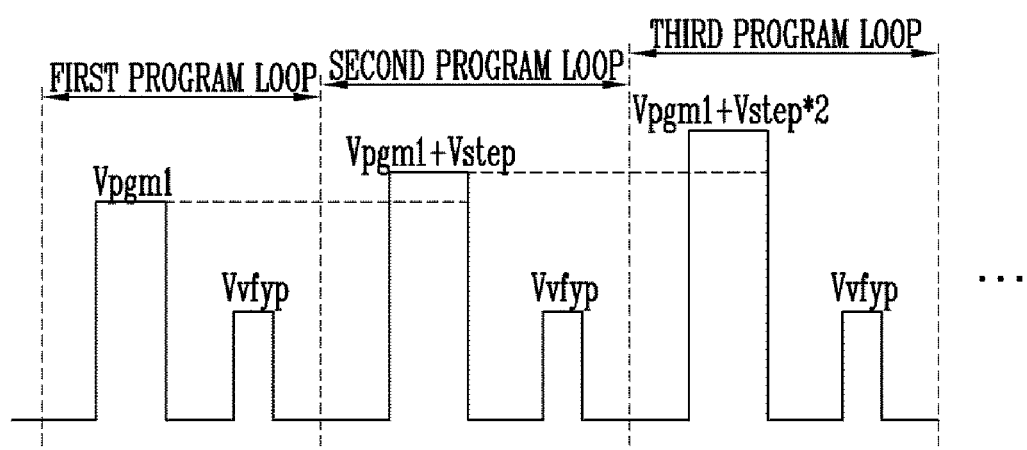
FIG. 8 is a diagram illustrating program loops.

FIG. 8 is a diagram illustrating program loops.

Referring to FIG. 8, FIG. 8 illustrates program loops each simultaneously performed in planes, in a multi-plane operation. Although only first to third program loops are illustrated in FIG. 7, a larger number of erase loops may be performed in each plane.

In the embodiment, each program loop may include a program operation and a program verify operation. Specifically, the first program loop may include a first program operation and a program verify operation, the second program loop may include a second program operation and a program verify operation, and the third program loop may include a third program operation and a program verify operation.

In the embodiment, in a multi-plane operation, the first program loop may be performed in each plane. The first program loop may be performed in a specific memory block included in each of the multi-planes.

Specifically, the first program operation, included in the first program loop, may be performed in each plane. In the first program operation, a first program voltage Vpgm1 may be applied to a selected word line of the specific memory block included in each of the multi-planes. After the first program voltage Vpgm1 is applied, the program verify operation, included in the first program loop, may be performed. In the program verify operation, a program verify voltage Vvfyp may be applied to a plurality of word lines, coupled to the specific memory block, included in each of the multi-planes. Through the program verify operation, it may be determined whether the memory cells, coupled to the selected word line of the specific memory block, included in each of the multi-planes, have been programmed.

When there is a plane in which the program verify operation, included in the first program loop, does not pass, the second program loop may be performed in the plane in which the program verify operation does not pass. That is, since the program speeds of memory cells, included in the respective multi-planes, are different from each other, there may be a plane in which the program verify operation does not pass. Therefore, an additional program loop may be performed in the plane in which the program verify operation does not pass.

Specifically, the second program operation, included in the second program loop, may be performed in the plane. In the second program operation, a second voltage, higher than the first program voltage Vpgm1, may be applied to the selected word line of a specific memory block included in the plane. Specifically, the second voltage Vpgm+Vstep may be a step voltage Vstep higher than the first program voltage Vpgm1. After the second voltage Vpgm+Vstep is applied, the program verify operation, included in the second program loop, may be performed. In the program verify operation, a program verify voltage Vvfyp may be applied to the plurality of word lines, coupled to the specific memory block, included in the plane. Through the program verify operation, it may be determined whether selected memory cells coupled to the selected word line of the specific memory block, included in the plane, has been programmed.

Subsequently, when there is a plane in which the program verify operation, included in the second program loop, does not pass, the third program loop may be performed in the plane in which the program verify operation does not pass.

In the third program operation, included in the third program loop, a third voltage, higher than the second voltage Vgmp1+Vstep, may be applied to the selected word line of a specific memory block included in the plane. Specifically, the third voltage Vpgm1+Vstep*2 may be a step voltage Vstep higher than the second voltage Vpgm+Vstep. Subsequently, it may be determined whether selected memory cells, coupled to the selected word line of the specific memory block, included in the plane, has been programmed through the program verify operation included in the third program loop.

When there is a plane in which the program verify operation does not pass, even after the first to third program loops have been performed, an additional program loop may be performed in the plane in which the program verify operation does not pass.

Figure 9:
FIG. 9 is a diagram, illustrating erase loops and program loops, which are performed in multi-planes.

FIG. 9 is a diagram, illustrating erase loops and program loops, which are performed in multi-planes.

Referring to FIG. 9, FIG. 9 is a diagram, illustrating the erase loops and the program loops, which are shown in FIGS. 7 and 8, based on a time sequence.

In the embodiment, in a multi-plane operation, the erase loops and the program loops, which are shown in FIG. 9, may be performed in each plane.

Specifically, a first erase loop may be performed in each plane. The first erase loop may include a first erase operation and an erase verify operation. When the erase verify operation, included in the first erase loop, does not pass in at least one of the plurality of planes, a second erase loop may be performed in each plane. Subsequently, when an erase verify operation, included in the second erase loop, does not pass in at least one of the plurality of planes, a third erase loop may be performed in each plane.

In FIG. 9, it is assumed that an erase verify operation of all the planes has passed in the Nth erase loop.

Since the erase verify operation of all the planes has passed in the Nth erase loop, program loops from a first program loop may be sequentially performed in each plane.

In the embodiment, the first program loop may be performed in each plane. The first program loop may include a first program operation and a program verify operation. When the program verify operation in the first program loop does not pass in at least one of the plurality of planes, a second program loop may be performed in each plane. Subsequently, when a program verify operation, included in the second program loop, does not pass in at least one of the plurality of planes, a third program loop may be performed in each plane.

When a program verify operation, included in a predetermined program loop, does not pass in all of the planes, a program operation may fail. That is, the program operation may only be completed when the program verify operation passes in all of the plurality of planes.

The word "predetermined" as used herein with respect to a parameter, such as a predetermined program loop, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 10:
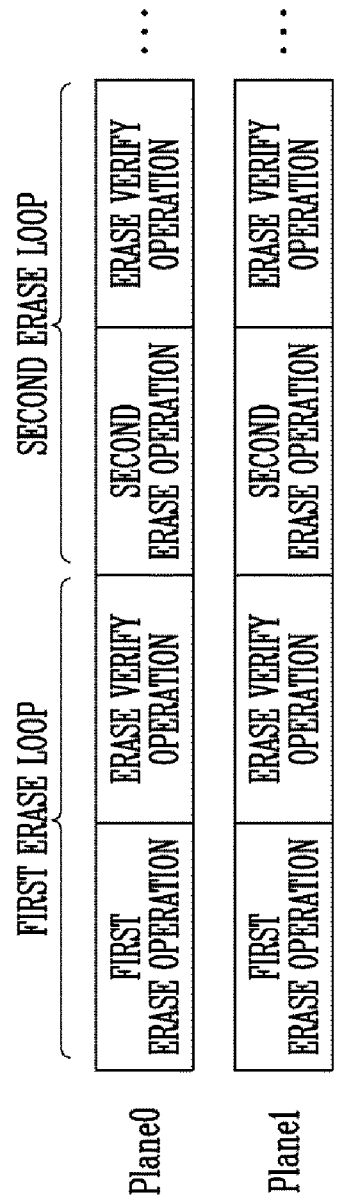
FIG. 10 is a diagram, illustrating erase loops, performed in multi-planes.

FIG. 10 is a diagram illustrating erase loops performed in multi-planes.

Referring to FIG. 10, FIG. 10 illustrates erase loops, performed in multi-planes (i.e., zeroth and first planes Plane0 and Plane1). FIG. 10 shows an embodiment with two planes in which the erase loops are performed. However, the invention is not limited thereto as there may be more or less than two planes. Also, in FIG. 10, the erase loops, performed in the zeroth and first planes Plane0 and Plane1, are first and second loops. However, a larger number of erase loops may be performed based on whether an erase verify operation, included in each of the erase loops, passes/fails.

In FIG. 10, the first erase loop may include a first erase operation and an erase verify operation. In addition, the second erase loop may include a second erase operation and an erase verify operation.

In the embodiment, the first erase operation, included in the first erase loop, may be performed in the zeroth and first planes Plane0 and Plane1. Based on a multi-plane operation, the first erase operation may be simultaneously performed in the zeroth and first planes Plane0 and Plane1. The first erase operation may be an operation to apply an erase voltage to a source select line or a substrate of a specific memory block included in each of multi-planes.

After the first erase operation is performed in the zeroth and first planes Plane0 and Plane1, the erase verify operation, included in the first erase loop, may be performed in the zeroth and first planes Plane0 and Plane1.

In FIG. 10, it is assumed that the erase verify operation, included in the first erase loop, does not pass in each of the zeroth and first planes Plane0 and Plane1. Therefore, an additional erase loop, the second erase loop, may be simultaneously performed in the zeroth and first planes Plane0 and Plane1.

In the embodiment, the second erase operation, included in the second erase loop, may be performed in the zeroth and first planes Plane0 and Plane1. Based on the multi-plane operation, the second erase operation may be simultaneously performed in the zeroth and first planes Plane0 and Plane1. Like the first erase operation, the second erase operation may be an operation to apply an erase voltage to the source select line or a substrate of the specific memory block included in each of the multi-planes. However, the erase voltage in the second erase operation may be a higher voltage, higher by a step voltage compared to the erase voltage in the first erase operation.

After the second erase operation is performed in the zeroth and first planes Plane0 and Plane1, the erase verify operation, included in the second erase loop, may be performed in the zeroth and first planes Plane0 and Plane1. Based on whether the erase verify operation, performed in the zeroth and first planes Plane0 and Plane1, passes, it may be determined whether an additional erase loop is to be performed in each plane.

Figure 11A:
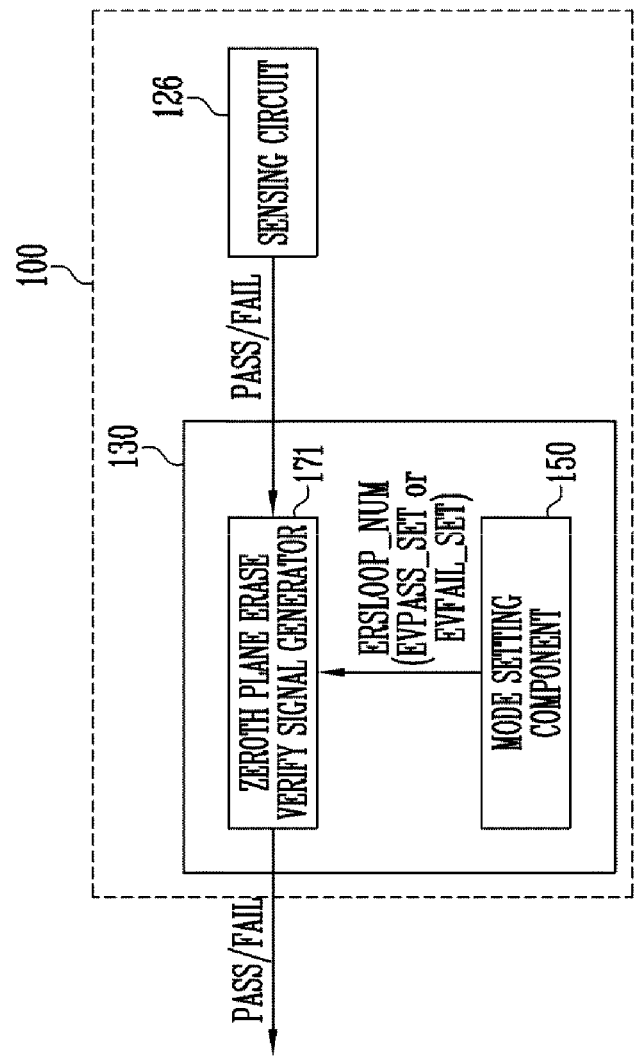

FIGS. 11A and 11B are diagrams illustrating the output of an erase verify pass signal or erase verify fail signal in a verify pass mode or verify fail mode and an operation of each plane.

FIG. 11A illustrates some of the components of the memory device (100 shown in FIG. 2). FIG. 11A assumes a case in which the memory device 100 includes zeroth and first planes Plane0 and Plane1. That is, FIG. 11A assumes a case in which the number of planes, included in the memory device 100, is 2, and the memory device 100 has a multi-plane structure. FIG. 11B illustrates operations performed in the multi-planes based on a time sequence.

Referring to FIG. 11A, the memory device 100 may include the sensing circuit 126 and the control logic 130, and the control logic 130 may include the mode setting component 150 and a zeroth plane erase verify signal generator 171. The zeroth plane erase verify signal generator 171 may be any one of the plane erase verify signal generators included in the erase verify signal generator (170 shown in FIG. 2). Although only the zeroth plane erase verify signal generator 171 is illustrated in FIG. 11A, contents of this drawing may be applied identically to a first plane erase verify signal generator (not shown).

Referring to FIG. 11A, it is assumed that the other components among the components included in the memory device, shown in FIG. 2, are omitted.

Referring to FIG. 11A, the sensing circuit 126 may output a pass or fail signal PASS/FAIL based on the result obtained by performing a sensing operation for each plane. The sensing operation may be an erase verify operation. That is, the sensing circuit 126 may output a pass or fail signal PASS/FAIL of an erase verify operation performed for each plane.

In the present disclosure, although the zeroth plane erase verify signal generator 171 receives a pass or fail signal PASS/FAIL of the zeroth plane Plane0 from the sensing circuit 126 in an erase verify operation, the zeroth plane erase verify signal generator 171 may output a pass signal PASS or fail signal FAIL, regardless of the pass or fail signal PASS/FAIL of the zeroth plane Plane0, which is received from the sensing circuit 126.

Specifically, before the memory device 100 performs a sensing operation, the mode setting component 150 may set an operation mode of the memory device 100 as a verify pass mode. The verify pass mode may be an operation mode of the memory device 100, which allows an erase verify operation, included in an erase loop, or a program verify operation, included in a program loop, to forcibly pass.

In the embodiment, before the memory device 100 performs a sensing operation, the mode setting component 150 may set the operation mode of the memory device 100 as a verify fail mode. The verify fail mode may be an operation mode of the memory device, which allow an erase verify operation, included in an erase loop, or a program verify operation, included in a program loop, to forcibly fail.

In the embodiment, when the operation mode of the memory device 100 is set as the verify pass mode or verify fail mode, the mode setting component 150 may output an erase loop number ERSLOOP_NUM of the zeroth plane Plane0 to the zeroth plane erase verify signal generator 171. The erase loop number ERSLOOP_NUM of the zeroth plane Plane0 may represent a specific erase loop in which an erase verify pass signal PASS or erase verify fail signal FAIL of the zeroth plane Plane0 is output.

In the embodiment, the erase loop number ERSLOOP_NUM may be set for each plane. That is, the mode setting component 150 may set an erase loop number ERSLOOP_NUM where the erase verify pass signal PASS or erase verify fail signal FAIL is output for each plane.

In the embodiment, each of a plurality of plane erase verify signal generators may count a number of erase loops performed in a corresponding plane. That is, referring to FIG. 11A, the zeroth plane erase verify signal generator 171 may count the number of erase loops performed in the zeroth plane Plane0.

When an erase loop number counted for each plane and the erase loop number ERSLOOP_NUM for each plane, which is received from the mode setting component 150, are the same, a plane erase verify signal generator of a corresponding plane may output an erase verify pass signal PASS or erase verify fail signal FAIL, in an erase verify operation included in a corresponding erase loop of the corresponding plane. That is, when the erase loop number counted by the zeroth plane erase verify signal generator 171 and the erase loop number ERSLOOP_NUM of the zeroth plane Plane0, which is received from the mode setting component 150, are the same, the zeroth plane erase verify signal generator 171 may output an erase verify pass signal PASS or erase verify fail signal FAIL.

Although the zeroth plane erase verify signal generator 171 has received the fail signal FAIL from the sensing circuit 126, the zeroth plane erase verify signal generator 171 may output the erase verify pass signal PASS.

On the contrary, although the zeroth plane erase verify signal generator 171 has received the pass signal PASS from the sensing circuit 126, the zeroth plane erase verify signal generator 171 may output the erase verify fail signal FAIL.

Consequently, the memory device 100 may allow an erase verify operation to forcibly pass or fail, when an erase loop is performed.

In the embodiment, when the zeroth plane erase verify signal generator 171 outputs the erase verify pass signal PASS, the zeroth plane erase verify signal generator 171 may output the pass signal PASS until an erase verify operation of the first plane Plane1 passes. That is, the pass signal PASS of a plane in which an erase verify operation has passed may be output until an erase verify operation of all the planes included in the memory device 100 passes.

Referring to FIG. 11A, it is assumed that the mode setting component 150 sets an erase loop number of the zeroth plane Plane0 to "2" and set an erase loop number of the first plane Plane1 to "3." Therefore, when a second erase loop is performed in the zeroth plane Plane0, an erase verify pass signal PASS may be output from the zeroth plane erase verify signal generator 171, in an erase verify operation included in the second erase loop. In addition, when a third erase loop is performed in the first plane Plane1, an erase verify pass signal PASS may be output from the first plane erase verify signal generator (not shown), in an erase verify operation included in the third erase loop.

In the embodiment, the mode setting component 150 may output erase verify pass setting information EVPASS_SET on the zeroth plane Plane0 to the zeroth plane erase verify signal generator 171 such that the zeroth plane erase verify signal generator 171 outputs an erase verify pass signal PASS corresponding to the erase verify operation included in the erase loop being performed in the zeroth plane Plane0.

Also, the mode setting component 150 may output erase verify fail setting information EVFAIL_SET on the zeroth plane Plane0 to the zeroth plane erase verify signal generator 171 such that the zeroth plane erase verify signal generator 171 outputs an erase verify fail signal FAIL corresponding to the erase verify operation included in the erase loop being performed in the zeroth plane Plane0.

The erase verify pass setting information EVPASS_SET and the erase verify fail setting information EVFAIL_SET may be set for each plane.

In the embodiment, when the zeroth plane erase verify signal generator 171 receives the erase verify pass setting information EVPASS_SET, the zeroth plane erase verify signal generator 171 may output an erase verify pass signal PASS. On the contrary, when the zeroth plane erase verify signal generator 171 receives the erase verify fail setting information EVFAIL_SET, the zeroth plane erase verify signal generator 171 may output an erase verify fail signal FAIL.

Referring to FIG. 11A, it is assumed that the mode setting component 150 outputs the erase verify pass setting information EVPASS_SET on the zeroth plane Plane0 while the second erase loop is being performed in the zeroth plane Plane0. Also, it is assumed that the mode setting component 150 outputs the erase verify pass setting information EVPASS_SET on the first plane Plane1 while the third erase loop is being performed in the first plane Plane1.

Referring to FIG. 11B, a first erase loop may be performed in the zeroth and first plane Plane0 and Plane1. The first erase loop may include a first erase operation and an erase verify operation. The first erase loop may be simultaneously performed in the zeroth and first planes Plane0 and Plane1. In addition to the first erase loop, all erase loops to be performed subsequently may be simultaneously performed in the zeroth and first planes Plane0 and Plane1.

In the embodiment, it is assumed that an operation mode of the memory device 100 is set as a verify pass mode before the first erase loop is performed in the zeroth and first planes Plane0 and Plane1. Also, it is assumed that the mode setting component 150 outputs erase loop numbers ERSLOOP_NUM of the zeroth and first planes Plane0 and Plane1, where the erase loop number of the zeroth plane Plane0 is set to "2" and the erase loop number of the first plane Plane1 is set to "3," respectively to the zeroth plane erase verify signal generator 171 and the first plane erase verify signal generator (not shown).

In the embodiment, the zeroth plane erase verify signal generator 171 and the first plane erase verify signal generator (not shown) may count erase loop numbers of the zeroth and first planes Plane0 and Plane1. The zeroth plane erase verify signal generator 171 and the first plane erase verify signal generator (not shown) may compare the counted erase loop numbers with the erase loop numbers ERSLOOP_NUM received from the mode setting component 150.

In FIGS. 11A and 11B, it is assumed that the erase verify operation fails as a result obtained by performing the first erase loop. Therefore, an additional erase loop, a second erase loop, may be performed in the zeroth and first planes Plane0 and Plane1. The second erase loop may be simultaneously performed in the zeroth and first planes Plane0 and Plane1.

Since the second erase loop is performed in the zeroth plane Plane0, the erase loop number ERSLOOP_NUM of the zeroth plane Plane0, which is counted by the zeroth plane erase verify signal generator 171, and the erase loop number ERSLOOP_NUM of the zeroth plane Plane0, which is received from the mode setting component 150, may be the same as "2." Therefore, when an erase verify operation, included in the second erase loop, is performed in the zeroth plane Plane0, regardless of the signal received from the sensing circuit 126, the zeroth plane erase verify signal generator 171 may output an erase verify pass signal PASS. Accordingly, erase verification of the zeroth plane Plane0 may pass.

However, since the counted erase loop number (2) of the first plane Plane1 and the erase loop number (3) of the first plane Plane1, which is received from the mode setting component 150 are not the same, the erase verify operation performed in the first plane Plane1 may fail. Therefore, an additional erase loop, a third erase loop, may be performed in the zeroth and first planes Plane0 and Plane1. The third erase loop may be simultaneously performed in the zeroth and first planes Plane0 and Plane1.

Subsequently, since the third erase loop is performed in the first plane Plane1, the erase loop number of the first plane Plane1, which counted by the first plane erase verify signal generator (not shown), and the erase loop number ERSLOOP_NUM of the first plane Plane1, which is received from the mode setting component 150, may be the same as "3." Therefore, the first plane erase verify signal generator (not shown) may output an erase verify pass signal PASS when an erase verify operation, included in the third erase loop, is performed in the first plane Plane1, regardless of the signal received from the sensing circuit 126. Accordingly, erase verification of the first plane Plane1 may pass.

The third erase loop may be performed even in the zeroth plane Plane0. Since the erase verify operation of the second erase loop performed in the zeroth plane Plane0 was allowed to forcibly pass by the zeroth plane erase verify signal generator 171, it is necessary to output an erase verify pass signal PASS of the zeroth plane Plane0 after the third erase loop.

In the embodiment, the zeroth plane erase verify signal generator 171 may receive erase verify pass setting information EVPASS_SET on the zeroth plane Plane0, while the second erase loop is being performed in the zeroth plane Plane0. The zeroth plane erase verify signal generator 171 may output an erase verify pass signal PASS when the erase verify operation, included in the second erase loop, is performed in the zeroth plane Plane0, by receiving the erase verify pass setting information EVPASS_SET. Therefore, erase verification of the zeroth plane Plane0 may pass.

In addition, the first plane erase verify signal generator (not shown) may receive erase verify pass setting information EVPASS_SET on the first plane Plane1, while the third erase loop is being performed in the first plane Plane1. The first plane erase verify signal generator (not shown) may output an erase verify pass signal PASS when the erase verify operation, included in the third erase loop, is performed in the first plane Plane1, by receiving the erase verify pass setting information EVPASS_SET. Therefore, erase verification of the first plane Plane1 may pass.

When both the erase verify operations of the zeroth and first planes Plane0 and Plane1 pass, a program loop may be then performed in the zeroth and first planes Plane0 and Plane1.

Figure 12:
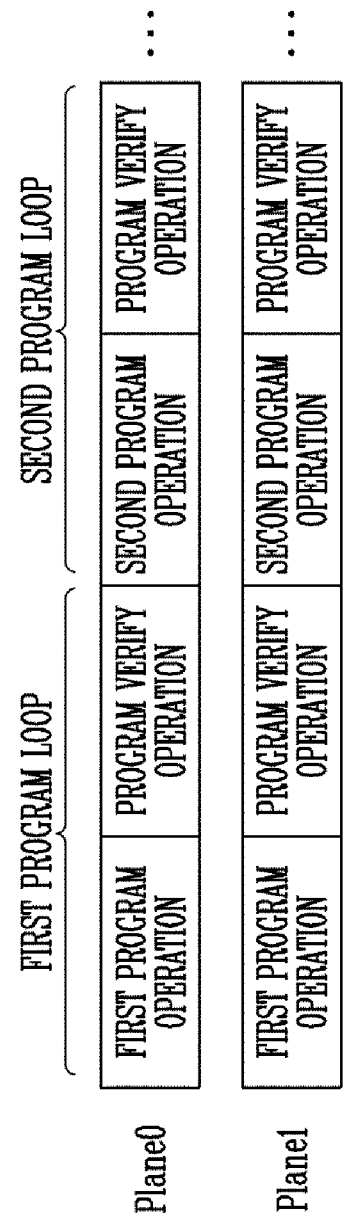
FIG. 12 is a diagram, illustrating program loops performed in multi-planes.

FIG. 12 is a diagram illustrating program loops performed in multi-planes.

Referring to FIG. 12, FIG. 12 illustrates program loops performed in multi-planes, i.e., zeroth and first planes Plane0 and Plane1. In FIG. 12, a case where the number of planes in which the program loops are performed is 2 is assumed. However, in another embodiment, the program loops may be performed in a larger number of planes. Also, in FIG. 12, the program loops performed in the zeroth and first planes Plane0 and Plane1 are first and second loops. However, a larger number of program loops may be performed based on whether a program verify operation included in each of the program loops passes/fails.

In FIG. 12, the first program loop may include a first program operation and a program verify operation. In addition, the second program loop may include a second program operation and a program verify operation.

In the embodiment, the first program operation, included in the first program loop, may be performed in the zeroth and first planes Plane0 and Plane1. Based on a multi-plane operation, the first program operation may be simultaneously performed in the zeroth and first planes Plane0 and Plane1. The first program operation may be an operation to apply a program voltage to a selected word line coupled to a specific memory block included in each of multi-planes.

After the first program operation is performed in the zeroth and first planes Plane0 and Plane1, the program verify operation included in the first program loop may be performed in the zeroth and first planes Plane0 and Plane1.

In FIG. 12, it is assumed that the program verify operation, included in the first program loop, does not pass in each of the zeroth and first planes Plane0 and Plane1. Therefore, an additional program loop, the second program loop, may be simultaneously performed in the zeroth and first planes Plane0 and Plane1.

In the embodiment, the second program operation, included in the second program loop, may be performed in the zeroth and first planes Plane0 and Plane1. Based on the multi-plane operation, the second program operation may be simultaneously performed in the zeroth and first planes Plane0 and Plane1. Like the first program operation, the second program operation may be an operation to apply a program voltage to the selected word line of the specific memory block included in each of the multi-planes. However, the program voltage in the second program operation may be a voltage higher by a step voltage than the program voltage in the first program operation.

After the second program operation is performed in the zeroth and first planes Plane0 and Plane1, the program verify operation, included in the second program loop, may be performed in the zeroth and first planes Plane0 and Plane1. Based on whether the program verify operation performed in the zeroth and first planes Plane0 and Plane1 passes, it may be determined whether an additional program loop is to be performed in each plane.

Figure 13A:
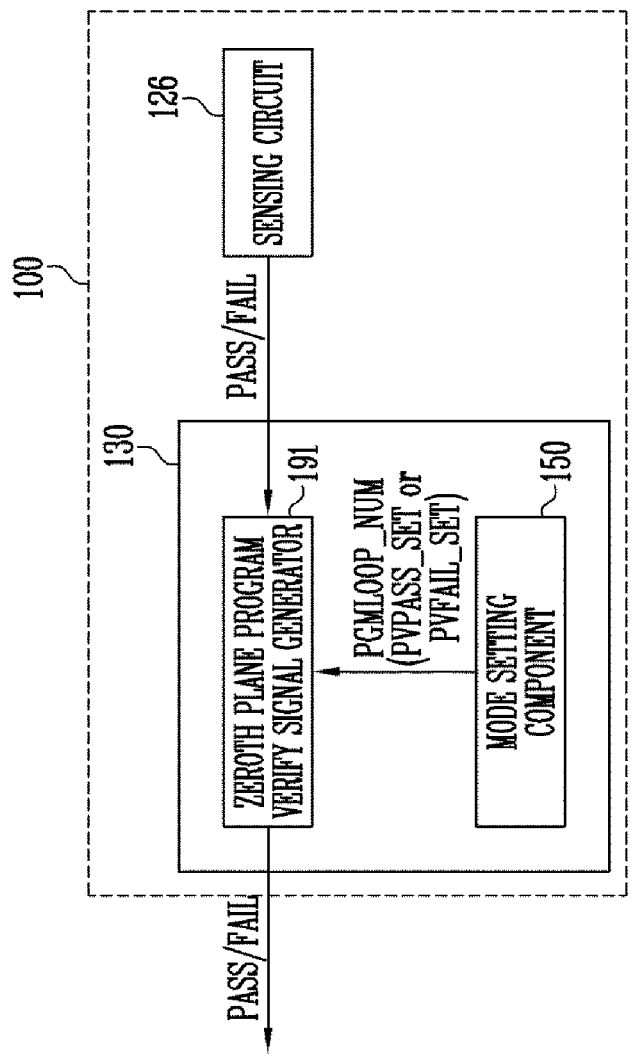

FIGS. 13A and 13B are diagrams illustrating output of a program verify pass signal or program verify fail signal in the verify pass mode or verify fail mode and an operation of each plane.

FIG. 13A illustrates some of the components of the memory device (100 shown in FIG. 2). FIG. 13A assumes that the memory device 100 includes zeroth and first planes Plane0 and Plane1. That is, FIG. 13A assumes that the number of planes, included in the memory device 100, is 2, and the memory device 100 has a multi-plane structure. FIG. 13B illustrates operations performed in the multi-planes based on a time sequence.

Referring to FIG. 13A, the memory device 100 may include the sensing circuit 126 and the control logic 130, and the control logic 130 may include the mode setting component 150 and a zeroth plane program verify signal generator 191. The zeroth plane program verify signal generator 191 may be any one of the plane program verify signal generators included in the program verify signal generator (190 shown in FIG. 2). Although only the zeroth plane program verify signal generator 191 is shown in FIG. 13A, contents of this drawing may be applied identically to a first plane program verify signal generator (not shown).

Referring to FIG. 13A, it is assumed that the other components among the components included in the memory device shown in FIG. 2 are omitted.

Referring to FIG. 13A, the sensing circuit 126 may output a pass or fail signal PASS/FAIL based on a result obtained by performing a sensing operation for each plane. The sensing operation may be a program verify operation. That is, the sensing circuit 126 may output a pass or fail signal PASS/FAIL of a program verify operation performed for each plane.

In the present disclosure, although the zeroth plane program verify signal generator 191 receives a pass or fail signal PASS/FAIL of the zeroth plane Plane0 from the sensing circuit 126 in a program verify operation, the zeroth plane program verify signal generator 191 may output a pass signal PASS or fail signal FAIL, regardless of the pass or fail signal PASS/FAIL of the zeroth plane Plane0, which is received from the sensing circuit 126.

Specifically, before the memory device 100 performs a sensing operation, the mode setting component 150 may set an operation mode of the memory device 100 as a verify pass mode. The verify pass mode may be an operation mode of the memory device 100, which allows an erase verify operation, included in an erase loop, or a program verify operation, included in a program loop, to forcibly pass.

In the embodiment, before the memory device 100 performs a sensing operation, the mode setting component 150 may set the operation mode of the memory device 100 as a verify fail mode. The verify fail mode may be an operation mode of the memory device, which allow an erase verify operation, included in an erase loop, or a program verify operation, included in a program loop, to forcibly fail.

In the embodiment, when the operation mode of the memory device 100 is set as the verify pass mode or verify fail mode, the mode setting component 150 may output a program loop number PGMLOOP_NUM of the zeroth plane Plane0 to the zeroth plane program verify signal generator 191. The program loop number PGMLOOP_NUM of the zeroth plane Plane0 may represent a specific program loop in which a program verify pass signal PASS or program verify fail signal FAIL of the zeroth plane Plane0 is output.

In the embodiment, the program loop number PGMLOOP_NUM may be set for each plane. That is, the mode setting component 150 may set a program loop number PGMLOOP_NUM where the program verify pass signal PASS or program verify fail signal FAIL is output for each plane.

In the embodiment, each of a plurality of plane program verify signal generators may count the number of program loops performed in a corresponding plane. That is, in FIG. 13A, the zeroth plane program verify signal generator 191 may count the number of program loops performed in the zeroth plane Plane0.

When a program loop number counted for each plane and the program loop number PGMLOOP_NUM for each plane, which is received from the mode setting component 150, are the same, a plane program verify signal generator of a corresponding plane may output a program verify pass signal PASS or program verify fail signal FAIL, in a program verify operation included in a corresponding erase loop of the corresponding plane. That is, when the program loop number counted by the zeroth plane program verify signal generator 191 and the program loop number PGMLOOP_NUM of the zeroth plane Plane0, which is received from the mode setting component 150, are the same, the zeroth plane program verify signal generator 191 may output a program verify pass signal PASS or program verify fail signal FAIL.

Although the zeroth plane program verify signal generator 191 has received the fail signal FAIL from the sensing circuit 126, the zeroth plane program verify signal generator 191 may output the program verify pass signal PASS.

On the contrary, although the zeroth plane program verify signal generator 191 has received the pass signal PASS from the sensing circuit 126, the zeroth plane program verify signal generator 191 may output the program verify fail signal FAIL.

Consequently, the memory device 100 may allow a program verify operation to forcibly pass or fail, when a program loop is performed.

In the embodiment, when the zeroth plane program verify signal generator 191 outputs the program verify pass signal PASS, the zeroth plane program verify signal generator 191 may output the pass signal PASS until a program verify operation of the first plane Plane1 passes. That is, the pass signal PASS of a plane in which a program verify operation has passed may be output until a program verify operation of all the planes included in the memory device 100 passes.

Referring to FIG. 13A, it is assumed that the mode setting component 150 sets a program loop number of the zeroth plane Plane0 to "2" and set a program loop number of the first plane Plane1 to "3." Therefore, when a second program loop is performed in the zeroth plane Plane0, a program verify pass signal PASS may be output from the zeroth plane program verify signal generator 191, in a program verify operation included in the second program loop. In addition, when a third program loop is performed in the first plane Plane1, a program verify pass signal PASS may be output from the first plane program verify signal generator (not shown), in a program verify operation included in the third program loop.

In the embodiment, the mode setting component 150 may output program verify pass setting information PVPASS_SET on the zeroth plane Plane0 to the zeroth plane program verify signal generator 191 such that the zeroth plane program verify signal generator 101 outputs a program verify pass signal PASS corresponding to the program verify operation included in the program loop being performed in the zeroth plane Plane0.

Also, the mode setting component 150 may output program verify fail setting information PVFAIL_SET on the zeroth plane Plane0 to the zeroth plane program verify signal generator 191 such that the zeroth plane program verify signal generator 191 outputs a program verify fail signal FAIL corresponding to the program verify operation, included in the program loop, being performed in the zeroth plane Plane0.

The program verify pass setting information PVPASS_SET and the program verify fail setting information PVFAIL_SET may be set for each plane.

In the embodiment, when the zeroth plane program verify signal generator 191 receives the program verify pass setting information PVPASS_SET, the zeroth plane program verify signal generator 191 may output a program verify pass signal PASS. On the contrary, when the zeroth plane program verify signal generator 191 receives the program verify fail setting information PVFAIL_SET, the zeroth plane program verify signal generator 191 may output a program verify fail signal FAIL.

Referring to FIG. 13A, it is assumed that the mode setting component 150 outputs the program verify pass setting information PVPASS_SET on the zeroth plane Plane0 while the second program loop is being performed in the zeroth plane Plane0. Also, it is assumed that the mode setting component 150 outputs the program verify pass setting information PVPASS_SET on the first plane Plane1 while the third program loop is being performed in the first plane Plane1.

Referring to FIG. 13B, a first program loop may be performed in the zeroth and first plane Plane0 and Plane1. The first program loop may include a first program operation and a program verify operation. The first program loop may be simultaneously performed in the zeroth and first planes Plane0 and Plane1. In addition to the first program loop, all erase loops to be performed subsequently may be simultaneously performed in the zeroth and first planes Plane0 and Plane1.

In the embodiment, it is assumed that an operation mode of the memory device 100 is set as a verify pass mode before the first program loop is performed in the zeroth and first planes Plane0 and Plane1. Also, it is assumed that the mode setting component 150 outputs program loop numbers PGMLOOP_NUM of the zeroth and first planes Plane0 and Plane1, where the program loop number of the zeroth plane Plane0 is set to "2" and the program loop number of the first plane Plane1 is set to "3," respectively to the zeroth plane program verify signal generator 191 and the first plane program verify signal generator (not shown).

In the embodiment, the zeroth plane program verify signal generator 191 and the first plane program verify signal generator (not shown) may count program loop numbers of the zeroth and first planes Plane0 and Plane1. The zeroth plane program verify signal generator 191 and the first plane program verify signal generator (not shown) may compare the counted program loop numbers with the program loop numbers PGMLOOP_NUM received from the mode setting component 150.

In FIGS. 13A and 13B, it is assumed that the program verify operation fails as a result obtained by performing the first program loop. Therefore, an additional program loop, a second program loop, may be performed in the zeroth and first planes Plane0 and Plane1. The second program loop may be simultaneously performed in the zeroth and first planes Plane0 and Plane1.

Since the second program loop is performed in the zeroth plane Plane0, the program loop number PGMLOOP_NUM of the zeroth plane Plane0, which is counted by the zeroth plane program verify signal generator 191, and the program loop number PGMLOOP_NUM of the zeroth plane Plane0, which is received from the mode setting component 150, may be the same as "2." Therefore, when a program verify operation, included in the second program loop, is performed in the zeroth plane Plane0, regardless of the signal received from the sensing circuit 126, the zeroth plane program verify signal generator 191 may output a program verify pass signal PASS. Accordingly, program verification of the zeroth plane Plane0 may pass.

However, since the counted program loop number (2) of the first plane Plane1 and the program loop number (3) of the first plane Plane1, which is received from the mode setting component 150 are not the same, the program verify operation performed in the first plane Plane1 may fail. Therefore, an additional program loop, a third program loop, may be performed in the zeroth and first planes Plane0 and Plane1. The third program loop may be simultaneously performed in the zeroth and first planes Plane0 and Plane1.

Subsequently, since the third program loop is performed in the first plane Plane1, the program loop number of the first plane Plane1, which counted by the first plane program verify signal generator (not shown), and the program loop number PGMLOOP_NUM of the first plane Plane1, which is received from the mode setting component 150, may be the same as "3." Therefore, the first plane program verify signal generator (not shown) may output a program verify pass signal PASS when a program verify operation, included in the third program loop, is performed in the first plane Plane1, regardless of the signal received from the sensing circuit 126. Accordingly, program verification of the first plane Plane1 may pass.

The third program loop may be performed even in the zeroth plane Plane0. Since the program verify operation of the second program loop performed in the zeroth plane Plane0 was allowed to forcibly pass by the zeroth plane program verify signal generator 191, it is necessary to output a program verify pass signal PASS of the zeroth plane Plane0 after the third program loop.

In the embodiment, the zeroth plane program verify signal generator 191 may receive program verify pass setting information PVPASS_SET on the zeroth plane Plane0, while the second program loop is being performed in the zeroth plane Plane0. The zeroth plane program verify signal generator 191 may output a program verify pass signal PASS when the program verify operation, included in the second program loop, is performed in the zeroth plane Plane0, by receiving the program verify pass setting information PVPASS_SET. Therefore, program verification of the zeroth plane Plane0 may pass.

In addition, the first plane program verify signal generator (not shown) may receive program verify pass setting information PVPASS_SET on the first plane Plane1, while the third program loop is being performed in the first plane Plane1. The first plane program verify signal generator (not shown) may output a program verify pass signal PASS when the program verify operation, included in the third program loop, is performed in the first plane Plane1, by receiving the program verify pass setting information PVPASS_SET. Therefore, program verification of the first plane Plane1 may pass.

When both the program verify operations of the zeroth and first planes Plane0 and Plane1 pass, all program pulses are ended.

Figure 14:
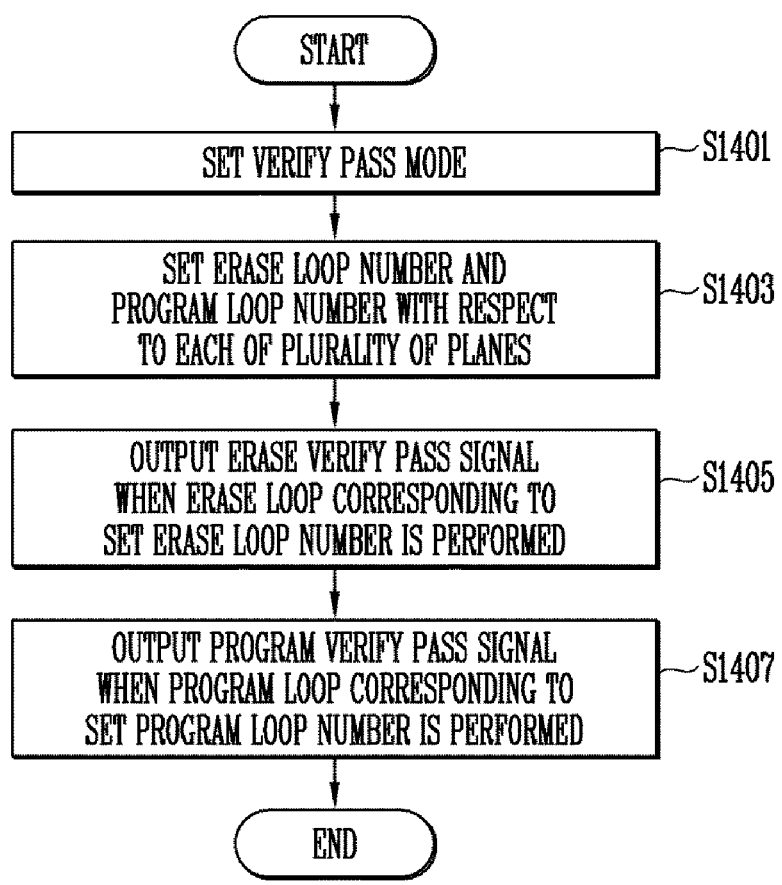
FIG. 14 is a diagram, illustrating an operation of the memory device, in accordance with an embodiment of the present disclosure.

FIG. 14 is a diagram, illustrating an operation of the memory device, in accordance with an embodiment of the present disclosure.

Referring to FIG. 14, in step S1401, an operation mode of the memory device may be set as a verify pass mode. The verify pass mode may be an operation mode of the memory device, which allows an erase verify operation, included in an erase loop, or a program verify operation, included in a program loop, to forcibly pass. When the operation mode of the memory device is set as the verify pass mode, the memory device may perform an operation to set the erase verify operation or program verify operation to pass.

In step S1403, the memory device may set an erase loop number and a program loop number with respect to each of a plurality of planes. The erase loop number or program loop number for each plane, which is set by the memory device, may be a loop number set to erase verification or program verification to forcibly pass for each plane. That is, in a specific erase loop or specific program loop, the memory device may output an erase verify pass signal or program verify pass signal for each plane.

In step S1405, the memory device may output an erase verify pass signal when an erase loop corresponding to the set erase loop number is performed. Specifically, the memory device may count an erase loop number in each plane, and determined whether the erase loop number counted for each plane is equal to that set for each plane. Subsequently, when the erase loop number counted for each plane is equal to that set for each plane, the memory device may output an erase verify pass signal of a corresponding plane. When an erase verify operation of all the planes, included in the memory device, passes, a program loop may be performed.

In step S1407, the memory device may output a program verify pass signal when a program loop corresponding to the set program loop number is performed. Specifically, the memory device may count a program loop number performed in each plane, and determine whether the program loop number counted for each plane is equal to that set for each plane. Subsequently, when the program loop number counted for each plane is equal to that set for each plane, the memory device may output a program verify pass signal of a corresponding plane.

Figure 15:
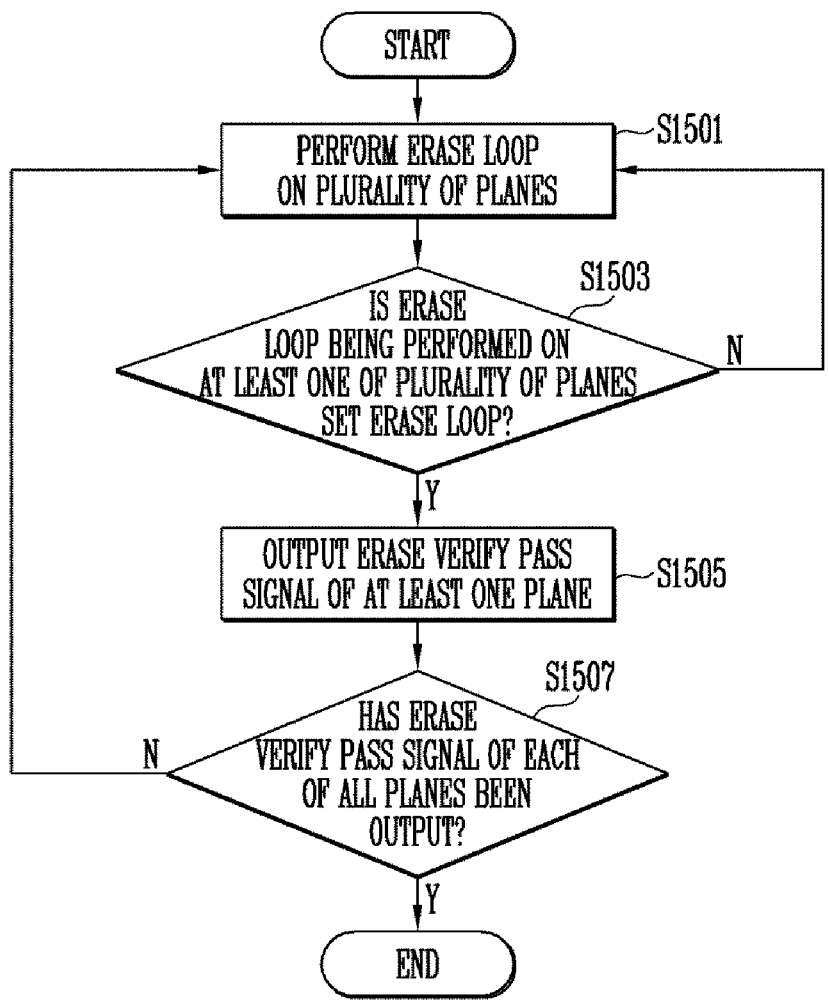
FIG. 15 is a diagram, illustrating an operation of the memory device, in accordance with an embodiment of the present disclosure.

FIG. 15 is a diagram, illustrating an operation of the memory device, in accordance with an embodiment of the present disclosure.

Referring to FIG. 15, in step S1501, the memory device may perform an erase loop on a plurality of planes. In a multi-plane operation, the erase loop may be simultaneously performed in the plurality of planes. However, before the erase loop is performed on the plurality of planes, an operation mode of the memory device may be set as a verify pass mode. Since an erase loop number where an erase verify pass signal is output may be set for each plane, times at which an erase verify operation is performed in the plurality of planes may be different from each other.

In step S1503, the memory device may determine whether an erase loop being performed on at least one of the plurality of planes is a set erase loop. That is, in the verify pass mode, the memory device may determine whether an erase loop number in a plane and the set erase loop number are the same.

In the embodiment, when the erase loop being performed on the at least one of the plurality of planes is not the set erase loop (N), the erase loop may be again performed on the plurality of planes (S1501).

In the embodiment, when the erase loop being performed on the at least one of the plurality of planes is the set erase loop (Y), an erase verify pass signal of at least one plane may be output (S1505). That is, when an erase loop number in any one of the plurality of planes and the set erase loop number are the same, an erase verify pass signal may be output regardless of a result obtained by performing an erase verify operation. Therefore, when an erase verify pass signal of a corresponding plane is output, an erase verify operation on the corresponding plane may forcibly pass.

Subsequently, the memory device may determine whether the erase verify pass signal of all the planes has been output (S1507). Specifically, an additional operation may be performed only when the erase verify pass signal of all the planes, included in the memory device, is output, and therefore, the memory device may determine whether erase verification of all the planes has passed.

In the embodiment, when the erase verify pass signal of all the planes is not output (N), the erase loop on the plurality of planes may be again performed (S1501). That is, the erase loop on the plurality of planes may be performed until the erase verification of all the planes passes. When the erase verify pass signal of all the planes is output (Y), the erase loop performed on the plurality of planes may be ended, and an additional operation may be performed.

Figure 16:
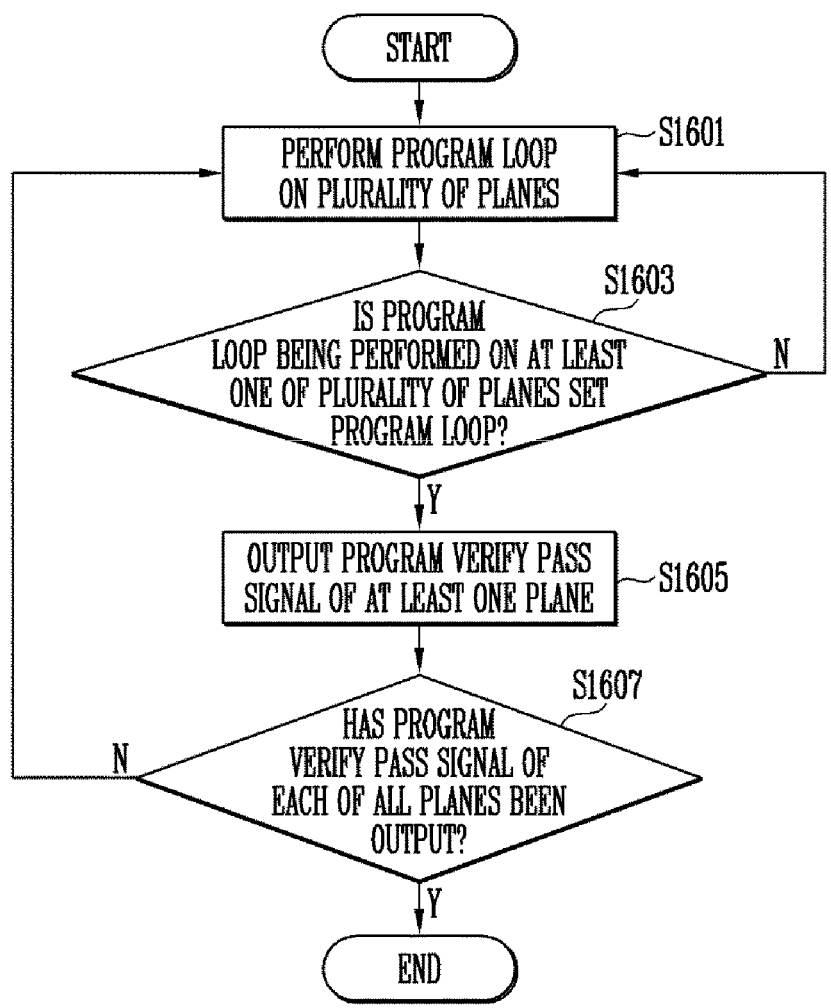
FIG. 16 is a diagram, illustrating an operation of the memory device, in accordance with an embodiment of the present disclosure.

FIG. 16 is a diagram, illustrating an operation of the memory device, in accordance with an embodiment of the present disclosure.

Referring to FIG. 16, in step S1601, the memory device may perform a program loop on a plurality of planes. In a multi-plane operation, the program loop may be simultaneously performed in the plurality of planes. However, after an operation of the memory device is set as a verify pass mode, a program loop number where a program verify pass signal is output may be set for each plane, and hence times at which a program verify operation is performed in the plurality of planes may be different from each other.

In step S1603, the memory device may determine whether a program loop being performed on at least one of the plurality of planes is a set program loop. That is, in the verify pass mode, the memory device may determine whether a program loop number in a plane and the set program loop number are the same.

In the embodiment, when the program loop being performed on the at least one of the plurality of planes is not the set program loop (N), the program loop may be again performed on the plurality of planes (S1601). A maximum program loop number in the plurality of planes may be predetermined. Therefore, when a program verify operation does not pass even though a predetermined maximum program loop has been performed in the plurality of planes, the program verify operation may be processed as a program fail.

In the embodiment, when the program loop being performed on the at least one of the plurality of planes is the set program loop (Y), a program verify pass signal of at least one plane may be output (S1605). That is, when a program loop number in any one of the plurality of planes and the set program loop number are the same, a program verify pass signal may be output regardless of a result obtained by performing a program verify operation. Therefore, when a program verify pass signal of a corresponding plane is output, a program verify operation on the corresponding plane may forcibly pass.

Subsequently, the memory device may determine whether the program verify pass signal of all the planes has been output (S1607).

In the embodiment, when the program verify pass signal of all the planes is not output (N), the program loop on the plurality of planes may be again performed (S1601). That is, the program loop on the plurality of planes may be performed until the program verification of all the planes passes. When the program verify pass signal of all the planes is output (Y), the program loop performed on the plurality of planes may be ended, and an additional operation may be performed.

Figure 17:
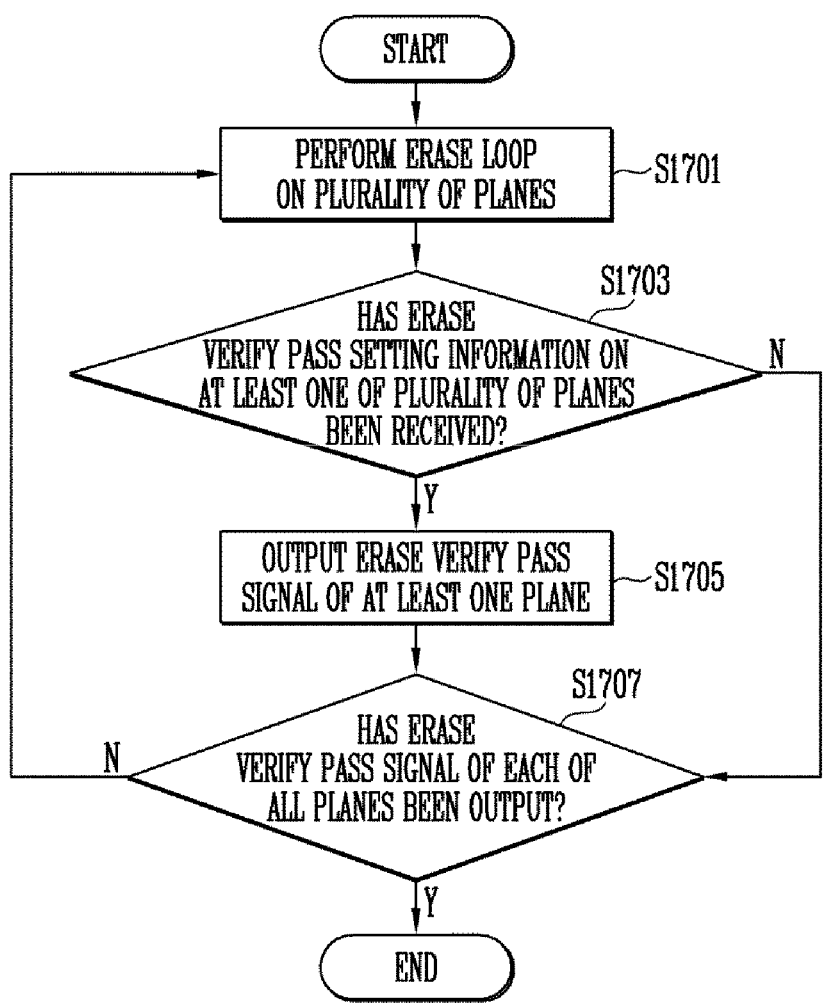
FIG. 17 is a diagram, illustrating an operation of the memory device, in accordance with an embodiment of the present disclosure.

FIG. 17 is a diagram, illustrating an operation of the memory device, in accordance with an embodiment of the present disclosure.

Referring to FIG. 17, in step S1701, the memory device may perform an erase loop on a plurality of planes. In a multi-plane operation, the erase loop may be simultaneously performed in the plurality of planes. Before the erase loop is performed in the plurality of planes, an operation mode of the memory device may be a verify pass mode.

In the embodiment, in the multi-plane operation, the memory device may set an erase verify operation of an erase loop being performed in any one of the plurality of planes to pass. Therefore, erase verify pass setting information on a plane of which erase verify operation passes may be generated.

In step S1703, the memory device may determine whether erase verify pass setting information on at least one of the plurality of planes has been received. That is, in the verify pass mode, the memory device may determine whether erase verify pass setting information capable of allowing an erase verify operation of an erase loop performed in any one plane among the plurality of planes to forcibly pass has been received.

In the embodiment, when the erase verify pass setting information on the at least one of the plurality of planes is received (Y), an erase verify pass signal of the at least one plane may be output (S1705). That is, an erase verify pass signal of an erase loop being performed in a specific plane among the plurality of planes may be output regardless of a result obtained by performing the erase verify operation. Therefore, when an erase verify pass signal of a corresponding plane is output, an erase verify operation of the corresponding plane may forcibly pass.

After the erase verify pass signal of the at least one plane is output, the memory device proceeds to step S1707.

In the embodiment, when the erase verify pass setting information on the at least one of the plurality of planes is not received (N) or when the erase verify pass signal of the at least one plane is output (S1705), the memory device may determine whether an erase verify pass signal of all the planes has been output (S1707). Specifically, an additional operation may be performed only when an erase verify pass signal of all the planes, included in the memory device, is output, and therefore, the memory device may determine whether erase verification of all the planes has passed.

In the embodiment, when the erase verify pass signal of all the planes is not output (N), the erase loop on the plurality of planes may be again performed (S1701). That is, the erase loop may be performed on the plurality of planes until the erase verification of all the planes passes. When the erase verify pass signal of all the planes is output (Y), the erase loop performed on the plurality of planes may be ended, and an additional operation may be performed.

Figure 18:
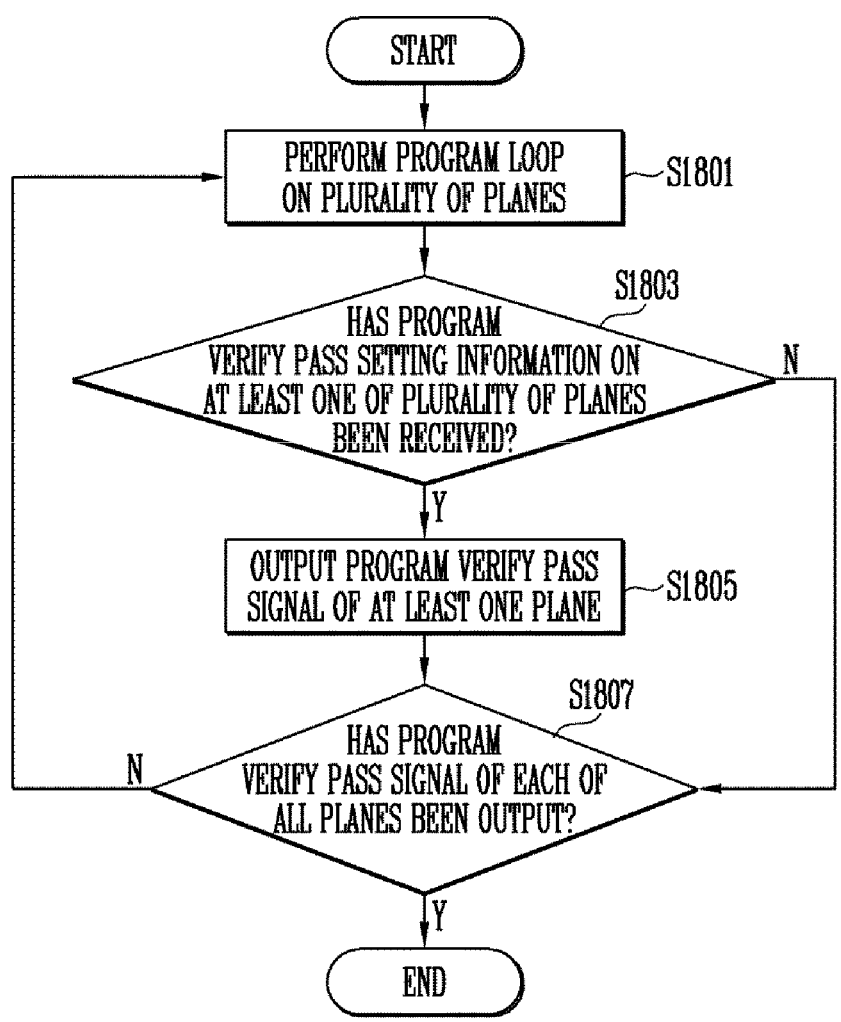
FIG. 18 is a diagram, illustrating an operation of the memory device, in accordance with an embodiment of the present disclosure.

FIG. 18 is a diagram, illustrating an operation of the memory device, in accordance with an embodiment of the present disclosure.

Referring to FIG. 18, in step S1801, the memory device may perform a program loop on a plurality of planes. In a multi-plane operation, the program loop may be simultaneously performed in the plurality of planes. Before the program loop is performed in the plurality of planes, an operation mode of the memory device may be a verify pass mode.

In the embodiment, in the multi-plane operation, the memory device may set a program verify operation of a program loop being performed in any one of the plurality of planes to pass. Therefore, program verify pass setting information on a plane of which program verify operation passes may be generated.

In step S1803, the memory device may determine whether program verify pass setting information on at least one of the plurality of planes has been received. That is, in the verify pass mode, the memory device may determine whether program verify pass setting information capable of allowing a program verify operation of a program loop performed in any one plane among the plurality of planes to forcibly pass has been received.

In the embodiment, when the program verify pass setting information on the at least one of the plurality of planes is received (Y), a program verify pass signal of the at least one plane may be output (S1805). That is, a program verify pass signal of a program loop being performed in a specific plane among the plurality of planes may be output regardless of a result obtained by performing the program verify operation. Therefore, when a program verify pass signal of a corresponding plane is output, a program verify operation of the corresponding plane may forcibly pass.

After the program verify pass signal of the at least one plane is output, the memory device proceeds to step S1807.

In the embodiment, when the program verify pass setting information on the at least one of the plurality of planes is not received (N) or when the program verify pass signal of the at least one plane is output (S1805), the memory device may determine whether a program verify pass signal of all the planes has been output (S1807). Specifically, an additional operation may be performed only when a program verify pass signal of all the planes, included in the memory device, is output, and therefore, the memory device may determine whether program verification of all the planes has passed.

In the embodiment, when the program verify pass signal of all the planes is not output (N), the program loop on the plurality of planes may be again performed (S1801). That is, the program loop may be performed on the plurality of planes until the program verification of all the planes passes. When the program verify pass signal of all the planes is output (Y), the program loop performed on the plurality of planes may be ended, and an additional operation may be performed.

Figure 19:
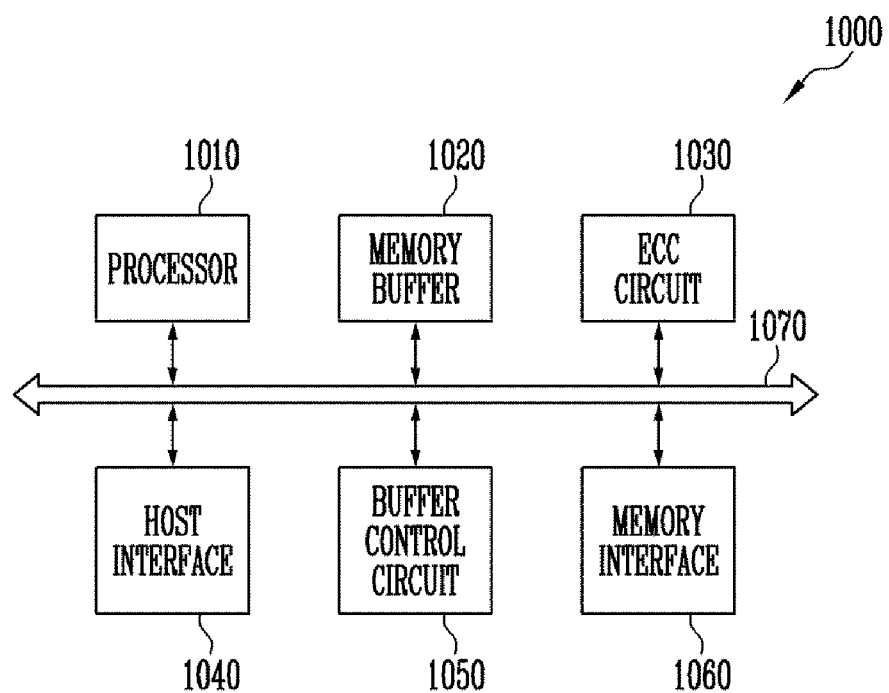
FIG. 19 is a diagram, illustrating another embodiment of a memory controller, shown in FIG. 1.

FIG. 19 is a diagram, illustrating another embodiment of the memory controller, shown in FIG. 1.

Referring to FIG. 19, a memory controller 1000 is coupled to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LPA, using a mapping table, to be translated into a PBA. Several address mapping methods of the FTL exist based on mapping units. A representative address mapping method includes a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

The processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 might not include the memory buffer 1020 and the buffer control circuit 1050.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and might not interfere or influence with each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 20:
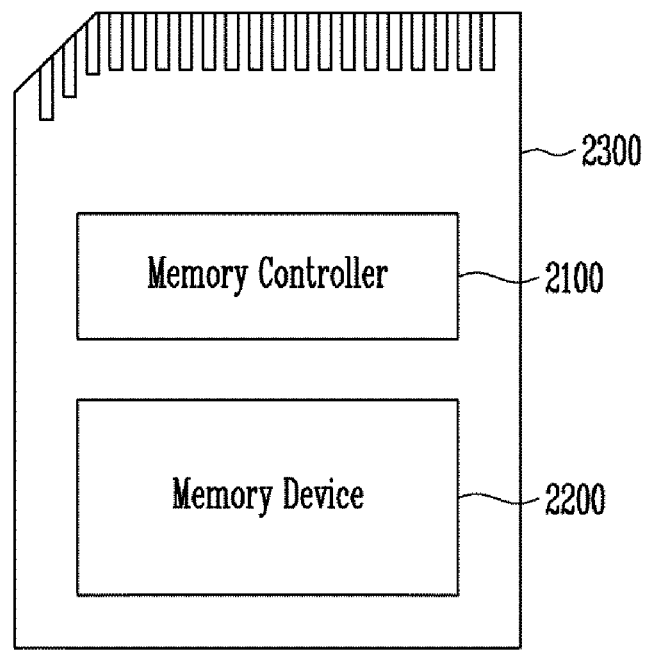
FIG. 20 is a block diagram, illustrating a memory card system to which the storage device is applied, in accordance with an embodiment of the present disclosure.

FIG. 20 is a block diagram, illustrating a memory card system to which the storage device is applied, in accordance with an embodiment of the present disclosure.

Referring to FIG. 20, the memory card system 2000 includes a memory controller 2100, a memory device, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to drive firmware for controlling the memory device 2200. The memory device 2200 may be implemented identically to the memory device 100 described with reference to FIG. 2.

In an example, the memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) based on a specific communication protocol. In an example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

In the embodiment, the memory device 2200 may operate in a verify pass mode. The verify pass mode may be an operation mode of the memory device 2200, which allows an erase verify operation, included in an erase loop, or a program verify operation, included in a program loop, to forcibly pass. In the verify pass mode, the memory device 2200 may set an erase loop number where an erase verify pass signal is output for each plane or a program loop number where a program verify pass signal is output for each plane. Alternatively, while a specific erase loop or specific program loop is being performed for each plane, the memory device 2200 may perform an operation to set an erase verify operation, included in the corresponding erase loop, or a program verify operation, included in the corresponding program loop, to forcibly pass.

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 21:
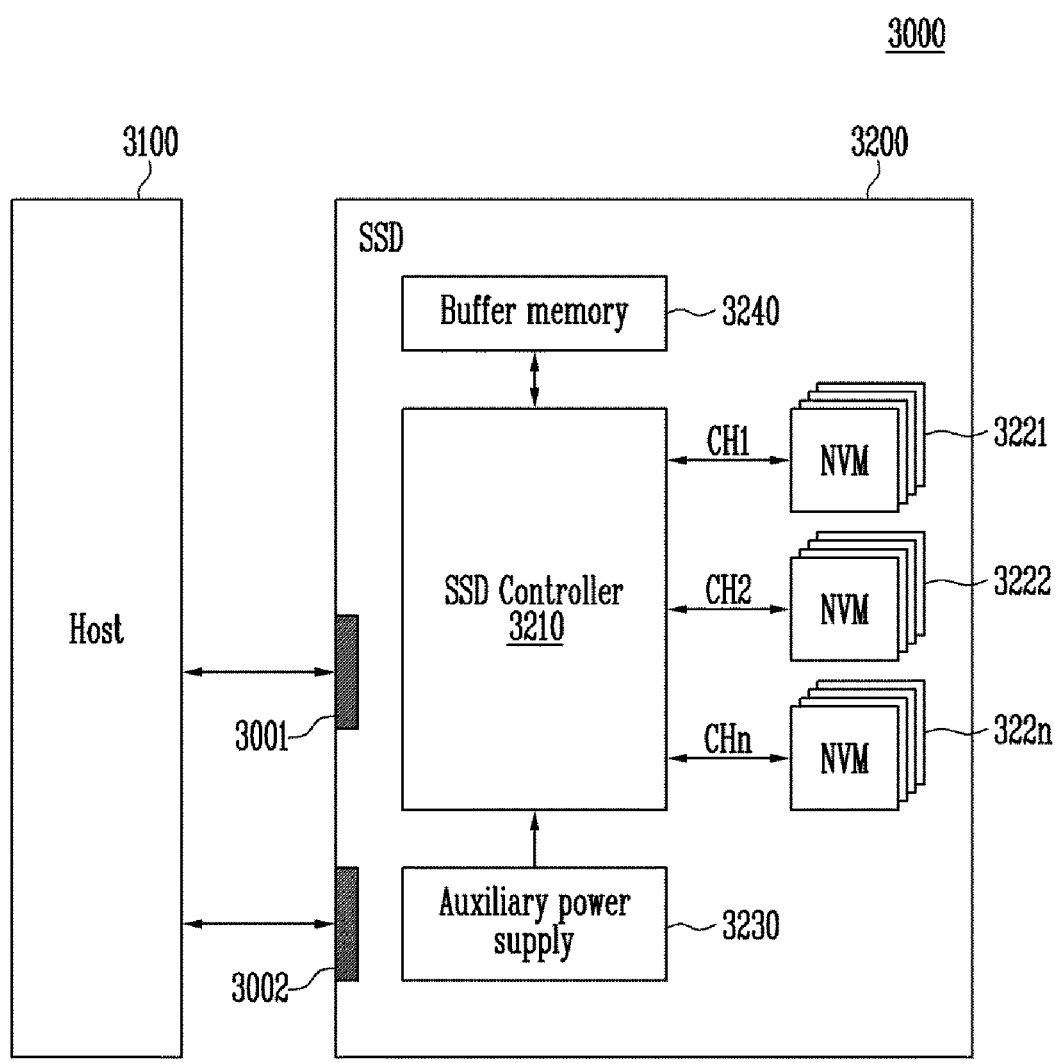
FIG. 21 is a block diagram, exemplarily illustrating a Solid State Drive (SSD) system to which the storage device is applied, in accordance with an embodiment of the present disclosure.

FIG. 21 is a block diagram, exemplarily illustrating a Solid State Drive (SSD) system to which the storage device is applied, in accordance with an embodiment of the present disclosure.

Referring to FIG. 21, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In the embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

In the embodiment, the plurality of flash memories 3221 to 322n may operate in a verify pass mode. The verify pass mode may be an operation mode of the plurality of flash memories 3221 to 322n, which allows an erase verify operation, included in an erase loop, or a program verify operation, included in a program loop, to forcibly pass. In the verify pass mode, the plurality of flash memories 3221 to 322n may set an erase loop number where an erase verify pass signal is output for each plane or a program loop number where a program verify pass signal is output for each plane. Alternatively, while a specific erase loop or specific program loop is being performed for each plane, the plurality of flash memories 3221 to 322n may perform an operation to set an erase verify operation, included in the corresponding erase loop, or a program verify operation, included in the corresponding program loop, to forcibly pass.

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 22:
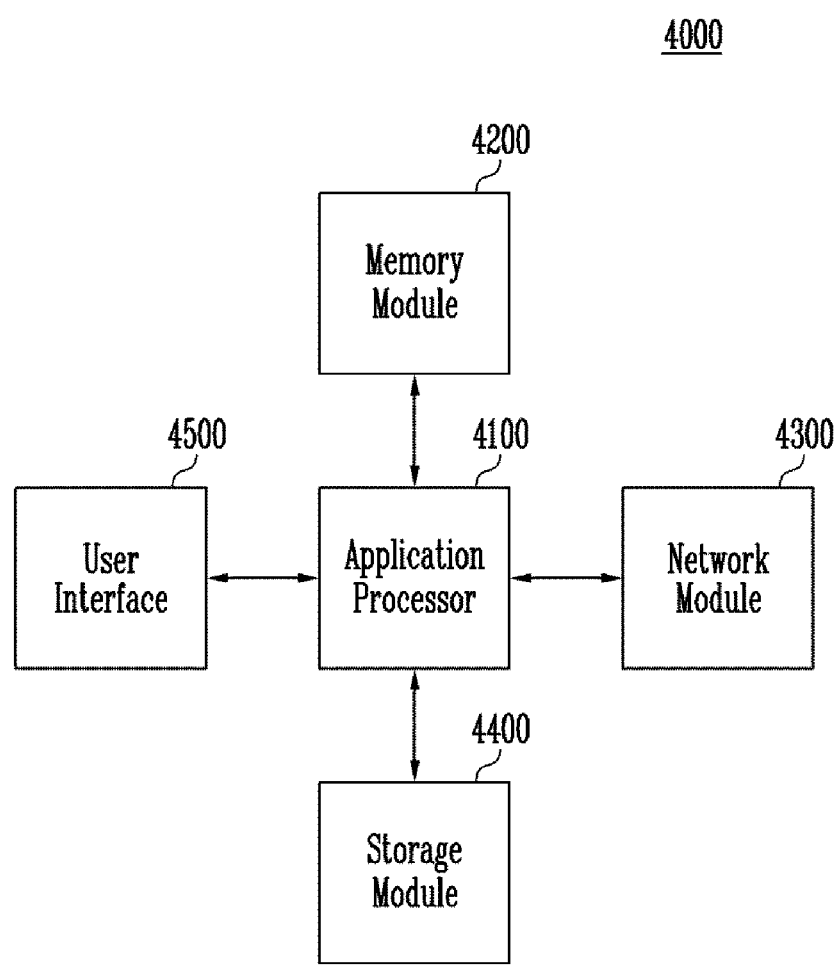
FIG. 22 is a block diagram, illustrating a user system to which the storage device is applied, in accordance with an embodiment of the present disclosure.

FIG. 22 is a block diagram, illustrating a user system to which the storage device is applied, in accordance with an embodiment of the present disclosure.

Referring to FIG. 22, the user system 4000 includes an application processor 4100, a memory module 4200, a network module 4300, a storage module 4400, and a user interface 4500.

The application processor 4100 may drive components, included in the user system 4000, an operating system (OS), a user program, or the like. In an example, the application processor 4100 may include controllers for controlling components, included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

In an example, the storage module 4400 may include a plurality of nonvolatile memory devices, and the plurality of nonvolatile memory devices may operate identically to the memory device described with reference to FIGS. 2 to 5. The storage module 4400 may operate identically to the storage device 50 described with reference to FIG. 1.

In the embodiment, the storage module 4400 may operate in a verify pass mode. The verify pass mode may be an operation mode of the storage module 4400, which allows an erase verify operation, included in an erase loop, or a program verify operation, included in a program loop, to forcibly pass. In the verify pass mode, the storage module 4400 may set an erase loop number where an erase verify pass signal is output for each plane or a program loop number where a program verify pass signal is output for each plane. Alternatively, while a specific erase loop or specific program loop is being performed for each plane, the storage module 4400 may perform an operation to set an erase verify operation, included in the corresponding erase loop, or a program verify operation, included in the corresponding program loop, to forcibly pass.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, a verify operation is controlled for each plane, so that the reliability of the memory device can be improved.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device, including a plurality of planes, the memory device comprising:
   a mode setting component configured to set an operation mode of the memory device as a verify pass mode to allow a verify operation, performed in the plurality of planes, to forcibly pass; and
   a verify signal generator configured to output a verify pass signal signaling that the verify operation has passed for each of the plurality of planes,
   wherein the mode setting component outputs verify pass setting information allowing the verify pass signal to be output for planes performing the verify operation among any planes in which the verify operation has already passed.

2. The memory device of claim 1, wherein the mode setting component:
   sets a loop number for each of the plurality of planes, representing a number of loops required to output the verify pass signal.

3. The memory device of claim 1, wherein the verify signal generator includes an erase verify signal generator configured to output an erase verify pass signal signaling that an erase verify operation has passed for each of the plurality of planes,
   wherein the mode setting component sets an erase loop number for each of the plurality of planes, representing a number of loops required to output the erase verify pass signal.

4. The memory device of claim 3, wherein the erase verify signal generator counts a number of erase loops performed on each of the plurality of planes.

5. The memory device of claim 1, wherein the verify signal generator includes an erase verify signal generator configured to output an erase verify fail signal, signaling that an erase verify operation has failed for each of the plurality of planes,
   wherein the mode setting component outputs erase verify fail setting information that allows the erase verify fail signal to be output for each of the plurality of planes.

6. The memory device of claim 5, wherein, when the erase verify signal generator receives the erase verify fail setting information, the erase verify signal generator outputs an erase verify fail signal of an erase loop being performed in a plane corresponding to the erase verify fail setting information among the plurality of planes.

7. A method for operating a memory device, including a plurality of planes, the method comprising:
   setting an operation mode of the memory device to allow a verify operation, performed in the plurality of planes, to forcibly pass; and
   outputting a verify pass signal signaling that the verify operation has passed for each of the plurality of planes,
   wherein the setting of the operation mode of the memory device includes outputting verify pass setting information allowing the verify pass signal to be output for planes performing the verify operation among any planes in which the verify operation has already passed.

8. The method of claim 7, wherein, in the outputting of the verify pass signal, an erase verify pass signal, signaling that an erase verify operation has passed for each of the plurality of planes, is output when the verify operation is the erase verify operation.

9. The method of claim 8, wherein the setting of the operation mode of the memory device includes setting an erase loop number for each of the plurality of planes, representing a number of loops required to output the erase verify pass signal.

10. The method of claim 9, wherein the outputting of the verify pass signal includes counting an erase loop number for each of the plurality of planes.

11. The method of claim 10, wherein, in the outputting of the verify pass signal, a signal is output when the counted erase loop number and the set erase loop number are the same for a given plane among the plurality of planes is output.

12. The method of claim 8, wherein the outputting of the verify pass signal includes outputting a signal of an erase loop being performed in a plane corresponding to the verify pass setting information among the plurality of planes.

* * * * *